(12) United States Patent
Doorhy et al.

(10) Patent No.: US 8,876,548 B2
(45) Date of Patent: Nov. 4, 2014

(54) RACK UNIT OUTLET SPACING FOR POWER OUTLET UNITS

(75) Inventors: Brendan F. Doorhy, Westmont, IL (US); Alva B. Eaton, Nottingham Park, IL (US); Matthew C. Isoda, Chicago, IL (US); Charles T. Newcomb, Naperville, IL (US); Elsa V. Madrigal, Chicago, IL (US); Shahriar Allen, Naperville, IL (US); Rhonda L. Johnson, Chicago Heights, IL (US); Donald J. Beran, Tinley Park, IL (US)

(73) Assignee: Panduit Corp., Tinley Park, IL (US)

( * ) Notice: Subject to any disclaimer, the term of this patent is extended or adjusted under 35 U.S.C. 154(b) by 1063 days.

(21) Appl. No.: 12/414,967

(22) Filed: Mar. 31, 2009

(65) Prior Publication Data

US 2009/0242265 A1 Oct. 1, 2009

Related U.S. Application Data

(60) Provisional application No. 61/040,870, filed on Mar. 31, 2008.

(51) Int. Cl.
| | |
|---|---|
| *H01R 13/60* | (2006.01) |
| *H02B 7/00* | (2006.01) |
| *H02B 1/20* | (2006.01) |
| *H05K 1/00* | (2006.01) |
| *H01R 25/00* | (2006.01) |
| *H05K 7/14* | (2006.01) |
| *H01R 13/68* | (2011.01) |
| *H01R 13/72* | (2006.01) |

(52) U.S. Cl.
CPC ............ *H01R 25/006* (2013.01); *H05K 7/1457* (2013.01); *H05K 7/1492* (2013.01); *H01R 13/68* (2013.01); *H01R 13/72* (2013.01)

USPC .............. 439/535; 361/600; 361/624; 174/53

(58) Field of Classification Search
USPC ........... 174/50, 194, 494, 520, 535, 541, 600, 174/53; 307/115, 149; 361/600, 626, 652, 361/634, 828, 624; 439/535
See application file for complete search history.

(56) References Cited

U.S. PATENT DOCUMENTS

| | | |
|---|---|---|
| 4,075,699 A | 2/1978 | Schneider et al. |
| 4,216,384 A | 8/1980 | Hurley |

(Continued)

FOREIGN PATENT DOCUMENTS

| | | |
|---|---|---|
| WO | 9310615 A1 | 5/1993 |
| WO | 2006015366 A2 | 2/2006 |

(Continued)

OTHER PUBLICATIONS

A-Neutronics, Inc. 24-Outlet 48" Rack Mount Power Strip Power Bar Brochure, six pages, dated Jan. 30, 2008.

(Continued)

*Primary Examiner* — Tran Nguyen
*Assistant Examiner* — Jose Gonzalez Quinone
(74) *Attorney, Agent, or Firm* — Christopher S. Clancy; James H. Williams

(57) ABSTRACT

Certain embodiments of the present invention provide a power outlet unit. The power outlet unit includes an inlet, a first group of outlets spaced apart at intervals of one rack unit, a first circuit breaker electrically connected to the inlet and the first group of outlets, a second group of outlets spaced apart at intervals of one rack unit, and a second circuit breaker electrically connected to the inlet and the second group of outlets.

23 Claims, 22 Drawing Sheets

(56) References Cited

U.S. PATENT DOCUMENTS

| | | | |
|---|---|---|---|
| 4,675,537 A | 6/1987 | Mione | |
| 4,719,364 A | 1/1988 | Pequet et al. | |
| 4,769,555 A | 9/1988 | Pequet et al. | |
| 4,918,562 A | 4/1990 | Pulizzi et al. | |
| 5,157,273 A | 10/1992 | Medendorp et al. | |
| 5,270,576 A | 12/1993 | Kahle | |
| 5,278,771 A | 1/1994 | Nyenya | |
| 5,424,903 A | 6/1995 | Schreiber | |
| 5,450,334 A | 9/1995 | Pulizzi et al. | |
| 5,506,573 A | 4/1996 | Ewing et al. | |
| 5,598,042 A | 1/1997 | Mix et al. | |
| 5,650,771 A | 7/1997 | Lee | |
| 5,690,198 A * | 11/1997 | Lohr | 191/12.2 R |
| 5,721,934 A | 2/1998 | Scheurich | |
| 5,774,528 A | 6/1998 | Bogner et al. | |
| 5,821,636 A | 10/1998 | Baker et al. | |
| 5,913,487 A | 6/1999 | Leatherman | |
| 5,923,103 A | 7/1999 | Pulizzi et al. | |
| 5,949,974 A | 9/1999 | Ewing et al. | |
| 6,137,706 A | 10/2000 | Nesbitt et al. | |
| 6,211,581 B1 | 4/2001 | Farrant | |
| 6,229,691 B1 | 5/2001 | Tanzer et al. | |
| 6,238,029 B1 | 5/2001 | Marzec et al. | |
| 6,250,956 B1 | 6/2001 | Pulizzi | |
| 6,380,862 B1 | 4/2002 | Karim et al. | |
| 6,442,017 B1 | 8/2002 | Ewing et al. | |
| 6,445,087 B1 | 9/2002 | Wang et al. | |
| 6,509,655 B1 | 1/2003 | Wang | |
| 6,679,722 B1 | 1/2004 | Pulizzi | |
| 6,711,613 B1 | 3/2004 | Ewing et al. | |
| 6,741,442 B1 | 5/2004 | McNally et al. | |
| 6,782,617 B2 | 8/2004 | Pulizzi | |
| 6,826,036 B2 | 11/2004 | Pereira | |
| 6,830,477 B2 | 12/2004 | Vander Vorste et al. | |
| 6,881,076 B2 * | 4/2005 | Baker | 439/76.1 |
| 6,882,530 B2 | 4/2005 | Cyphers et al. | |
| 6,937,461 B1 | 8/2005 | Donahue, IV | |
| 6,967,283 B2 | 11/2005 | Rasmussen et al. | |
| 7,010,589 B2 | 3/2006 | Ewing et al. | |
| 7,043,542 B2 | 5/2006 | Sato et al. | |
| 7,043,543 B2 | 5/2006 | Ewing et al. | |
| 7,099,934 B1 | 8/2006 | Ewing et al. | |
| 7,116,550 B2 | 10/2006 | Ewing et al. | |
| 7,137,850 B2 | 11/2006 | Ewing et al. | |
| 7,140,903 B2 | 11/2006 | Pulizzi et al. | |
| 7,141,891 B2 | 11/2006 | McNally et al. | |
| 7,162,521 B2 | 1/2007 | Ewing et al. | |
| 7,171,461 B2 | 1/2007 | Ewing et al. | |
| 7,196,900 B2 | 3/2007 | Ewing et al. | |
| 7,215,535 B2 | 5/2007 | Pereira | |
| 7,268,998 B2 | 9/2007 | Ewing et al. | |
| 7,312,980 B2 | 12/2007 | Ewing et al. | |
| 7,324,006 B2 | 1/2008 | Godard | |
| 7,368,830 B2 | 5/2008 | Cleveland et al. | |
| 7,400,493 B2 | 7/2008 | Ewing et al. | |
| 7,414,329 B2 | 8/2008 | Cleveland et al. | |
| 7,447,002 B2 * | 11/2008 | Ewing et al. | 361/623 |
| 7,457,106 B2 | 11/2008 | Ewing et al. | |
| 7,522,036 B1 | 4/2009 | Preuss et al. | |
| 7,535,696 B2 | 5/2009 | Ewing et al. | |
| 7,672,104 B2 | 3/2010 | Reynolds et al. | |
| 7,702,771 B2 | 4/2010 | Ewing et al. | |
| 7,718,889 B2 | 5/2010 | Rasmussen et al. | |
| 7,774,443 B2 | 8/2010 | Ewing et al. | |
| 2002/0002582 A1 | 1/2002 | Ewing et al. | |
| 2003/0077928 A1* | 4/2003 | Vander Vorste et al. | 439/106 |
| 2004/0008493 A1* | 1/2004 | Robbins et al. | 361/725 |
| 2004/0047095 A1 | 3/2004 | Reynolds et al. | |
| 2004/0189161 A1* | 9/2004 | Davis et al. | 312/265.3 |
| 2004/0215763 A1 | 10/2004 | Ewing et al. | |
| 2004/0231248 A1* | 11/2004 | Walker et al. | 52/27 |
| 2005/0052814 A1* | 3/2005 | McNally et al. | 361/166 |
| 2005/0083651 A1* | 4/2005 | Smith et al. | 361/687 |
| 2005/0101193 A1* | 5/2005 | Godard | 439/652 |
| 2005/0185363 A1* | 8/2005 | Rasmussen et al. | 361/624 |
| 2005/0203987 A1 | 9/2005 | Ewing et al. | |
| 2005/0223090 A1 | 10/2005 | Ewing et al. | |
| 2005/0259383 A1* | 11/2005 | Ewing et al. | 361/622 |
| 2006/0031453 A1 | 2/2006 | Ewing et al. | |
| 2006/0031454 A1 | 2/2006 | Ewing et al. | |
| 2006/0092600 A1* | 5/2006 | Ewing et al. | 361/626 |
| 2006/0094299 A1 | 5/2006 | Ewing et al. | |
| 2006/0259538 A1 | 11/2006 | Ewing et al. | |
| 2007/0016664 A1 | 1/2007 | Ewing et al. | |
| 2007/0025066 A1 | 2/2007 | Ewing et al. | |
| 2007/0050443 A1 | 3/2007 | Ewing et al. | |
| 2007/0076340 A1 | 4/2007 | Ewing et al. | |
| 2007/0130243 A1 | 6/2007 | Ewing et al. | |
| 2007/0136453 A1 | 6/2007 | Ewing et al. | |
| 2007/0140238 A1 | 6/2007 | Ewing et al. | |
| 2007/0159752 A1 | 7/2007 | Ewing et al. | |
| 2007/0159775 A1 | 7/2007 | Ewing et al. | |
| 2007/0161293 A1* | 7/2007 | Ewing et al. | 439/620.26 |
| 2007/0168088 A1 | 7/2007 | Ewing et al. | |
| 2007/0184721 A1* | 8/2007 | Ewing et al. | 439/620.26 |
| 2007/0245012 A1 | 10/2007 | Ewing et al. | |
| 2007/0276548 A1 | 11/2007 | Uzunovic et al. | |
| 2008/0076291 A1 | 3/2008 | Ewing et al. | |
| 2008/0093927 A1* | 4/2008 | Ewing et al. | 307/23 |
| 2008/0136607 A1 | 6/2008 | Ratcliff et al. | |
| 2008/0179953 A1* | 7/2008 | Reese et al. | 307/38 |
| 2008/0198536 A1 | 8/2008 | Ewing et al. | |
| 2008/0238404 A1 | 10/2008 | Ferguson | |
| 2008/0272878 A1 | 11/2008 | Ewing et al. | |
| 2009/0061691 A1 | 3/2009 | Ewing et al. | |
| 2009/0180241 A1 | 7/2009 | Ewing et al. | |
| 2009/0234512 A1 | 9/2009 | Ewing et al. | |
| 2009/0322160 A1 | 12/2009 | DuBose et al. | |

FOREIGN PATENT DOCUMENTS

| | | |
|---|---|---|
| WO | 2006015366 A3 | 2/2006 |
| WO | 2006041803 A2 | 4/2006 |
| WO | 2006041803 A3 | 4/2006 |
| WO | 2007056116 A2 | 5/2007 |
| WO | 2007056116 A3 | 5/2007 |
| WO | 2007082071 A2 | 7/2007 |
| WO | 2007082071 A3 | 7/2007 |
| WO | 2008036848 A2 | 3/2008 |
| WO | 2008036848 A3 | 3/2008 |
| WO | 2009086485 A1 | 7/2009 |

OTHER PUBLICATIONS

Server Technology, Inc. Remote Power On/Off Installation & Operations Manual, thirty-two pages, copyright 1993.

Black Box Network Services POW-R-SWITCH Brochure (Document No. 15664), fourteen pages, copyright 1996.

BayTech RPC Series Brochure (Remote Power Control), four pages.

Pulizzi Engineering Inc. Catalog, AC Power for Worldwide Requirements, Selection & Design Guide, thirty-one pages.

Pulizzi Engineering Inc. Catalog, Power Distribution & Control for Worldwide Applications, forty-eight pages.

APC MasterSwitch, available at http://web.archive.org/web/20000816192738/www.apc.com/products/masterswitch/index.cfm, archived on Aug. 16, 2000, last visited on Jul. 16, 2010 (2 pages).

APC MasterSwitch Web-Based Management, available at http://web.archive.org/web/20000823213938/www.apc.com/products/masterswitch/web_interface.cfm, archived on Aug. 23, 2000, last visited on Jul. 16, 2010 (2 pages).

APC MasterSwitch Plus, available at http://web.archive.org/web/20000829102334/www.apc.com/products/masterswitch_plus/index.cfm, archived on Aug. 29, 2000, last visited on Jul. 16, 2010 (2 pages).

APC MasterSwitch Plus Web-Based Management, available at http://web.archive.org/web/20000608132828/www.apc.com/products/masterswitch_plus/web_interface.cfm, archived on Jun. 8, 2000, last visited on Jul. 16, 2010 (2 pages).

APC MasterSwitch Vertical Mount, available at http://web.archive.org/web/20010418234525/159.215.19.5/currents1.nsf/headlines/MSVITTCVM?OpenDocument, archived on Apr. 18, 2001, last visited on Jul. 16, 2010 (2 pages).

(56) References Cited

OTHER PUBLICATIONS

APC Environmental Monitoring Card, available at http://web.archive.org/web/20000829101734/www.apc.com/products/management/environmental.cfm, archived on Aug. 29, 2000, last visited on Jul. 16, 2010 (2 pages).

APC PowerView, available at http://web.archive.org/web/20000829101707/www.apc.com/products/accessories/powerview.cfm, archived on Aug. 29, 2000, last visited on Jul. 16, 2010 (1 page).

IEEE Transactions on Consumer Electronics, vol. 53, No. 4, Nov. 2007 (8 pages).

* cited by examiner

RACK UNIT OUTLET SPACING FOR POWER OUTLET UNITS

CROSS-REFERENCE TO RELATED APPLICATION

This application claims priority to U.S. Provisional Application No. 61/040,870, filed Mar. 31, 2008.

BACKGROUND OF THE INVENTION

The present invention relates to a power outlet unit. More particularly, the present invention relates to a power outlet unit that is capable of providing at least 2 amperes per rack unit.

Power outlet units are well known in the art. Typically, power outlet units are installed in network cabinets to provide power to one or more network components, such as servers, switches, and patch panels, which typically occupy at least one rack unit. Existing power outlet units are capable of providing 1 ampere per rack unit. However, as technology advances, network components will require at least 2 amperes per rack unit to achieve higher speeds and improved performance.

Therefore, there is a need for a power outlet unit that is capable of providing at least 2 amperes per rack unit.

SUMMARY OF THE INVENTION

Certain embodiments of the present invention provide a power outlet unit. The power outlet unit includes an inlet, a first group of outlets spaced apart at intervals of one rack unit, a first circuit breaker electrically connected to the inlet and the first group of outlets, a second group of outlets spaced apart at intervals of one rack unit, and a second circuit breaker electrically connected to the inlet and the second group of outlets.

Figure 1:
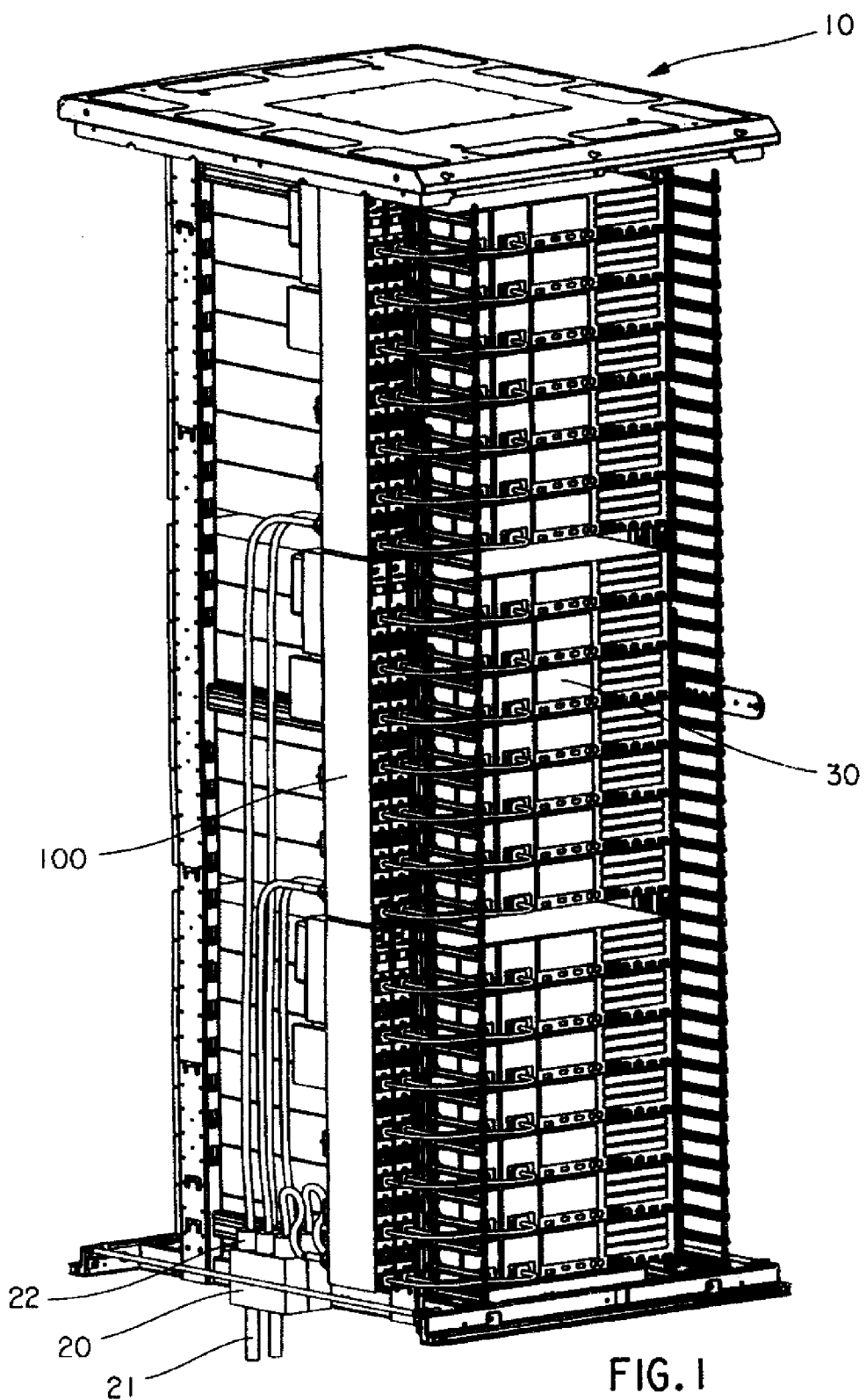
FIG. 1 is a perspective view of 6 POU's installed in a network cabinet according to an embodiment of the present invention.

The foregoing summary, as well as the following detailed description of certain embodiments of the present invention, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF THE INVENTION

FIGS. 1-22 illustrate a power outlet unit ("POU") 100 according to one or more embodiments of the present invention. The POU 100 includes a housing 110, one or more inlets 120, a plurality of outlets 130, and one or more circuit breakers 140. In certain embodiments of the present invention, the POU 100 includes an expansion module 150 and a panel management module ("PMM") or a peripheral expansion management module ("PEMM") 160. The housing 110 includes a top 111, a bottom 112, a front 113, a back 114, and two sides 115, which enclose the components 120-160 of the POU 100.

Figure 7:
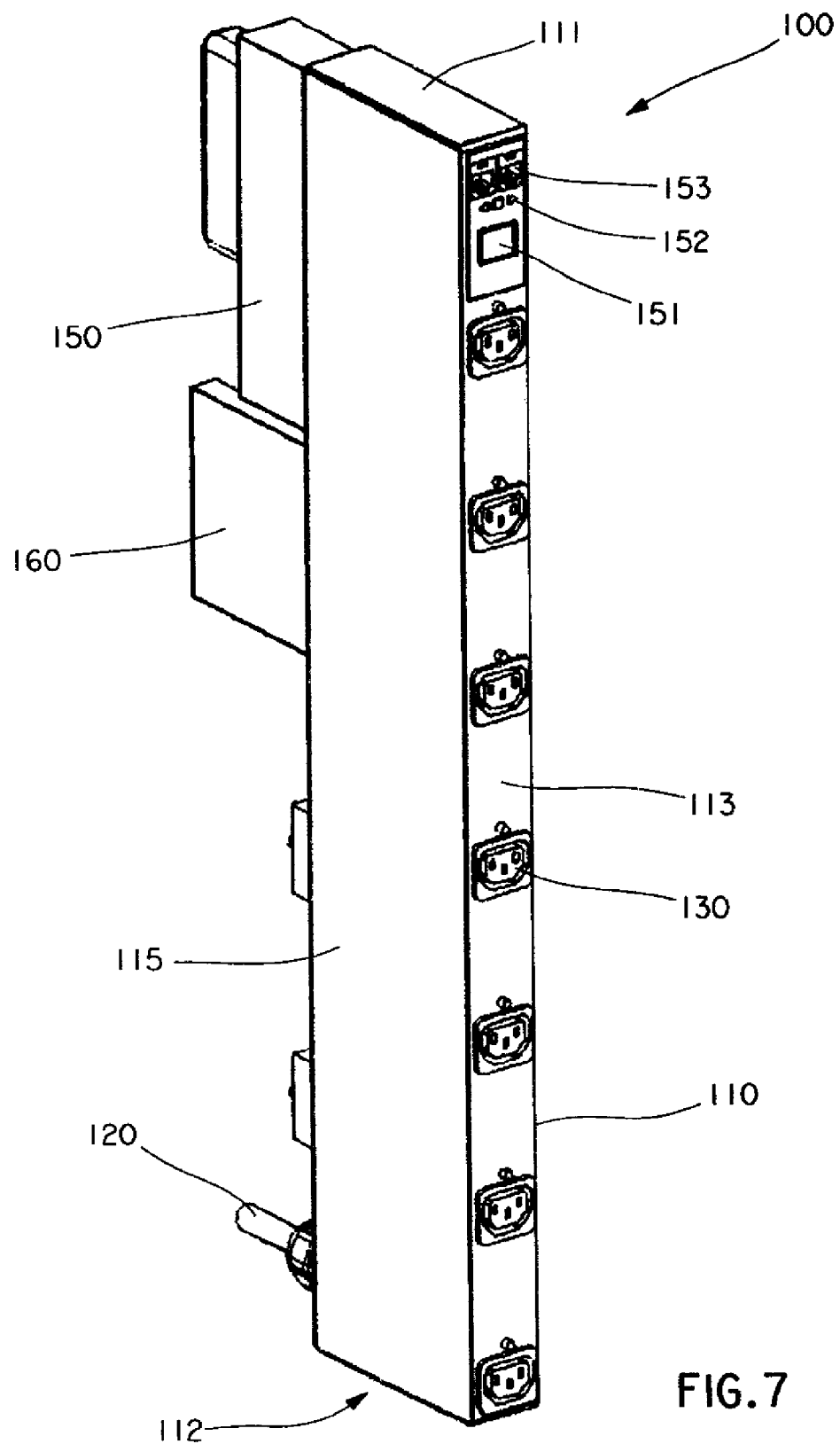
FIG. 7 is a perspective view of one of the POU's of FIG. 1.

As best seen in FIG. 1, the POU 100 may be installed in a network cabinet 10. For example, the cabinet 10 may include 6 POU's 100, as shown in FIG. 1. Power is supplied to the 6 POU's via 2 distribution boxes 20, although any number of distribution boxes 20 may be included in the cabinet 10. Each distribution box 20 includes 1 inlet 21 and 3 outlets 22, and therefore, is adapted to provide power to 3 POU's, although any number of inlets 21 and outlets 22 may be included in the distribution box 20. Alternatively, power may be supplied directly to the inlet 120 of the POU 100. However, the 6 POU's 100 would require 6 separate power supply feed lines. As best seen in FIG. 7, the POU 100 includes 1 inlet 120, although any number of inlets 120 may be included in the POU 100. For example, if each POU 100 includes 2 inlets 120, then 6 POU's 100 would require 12 separate power supply feed lines.

Figure 10:
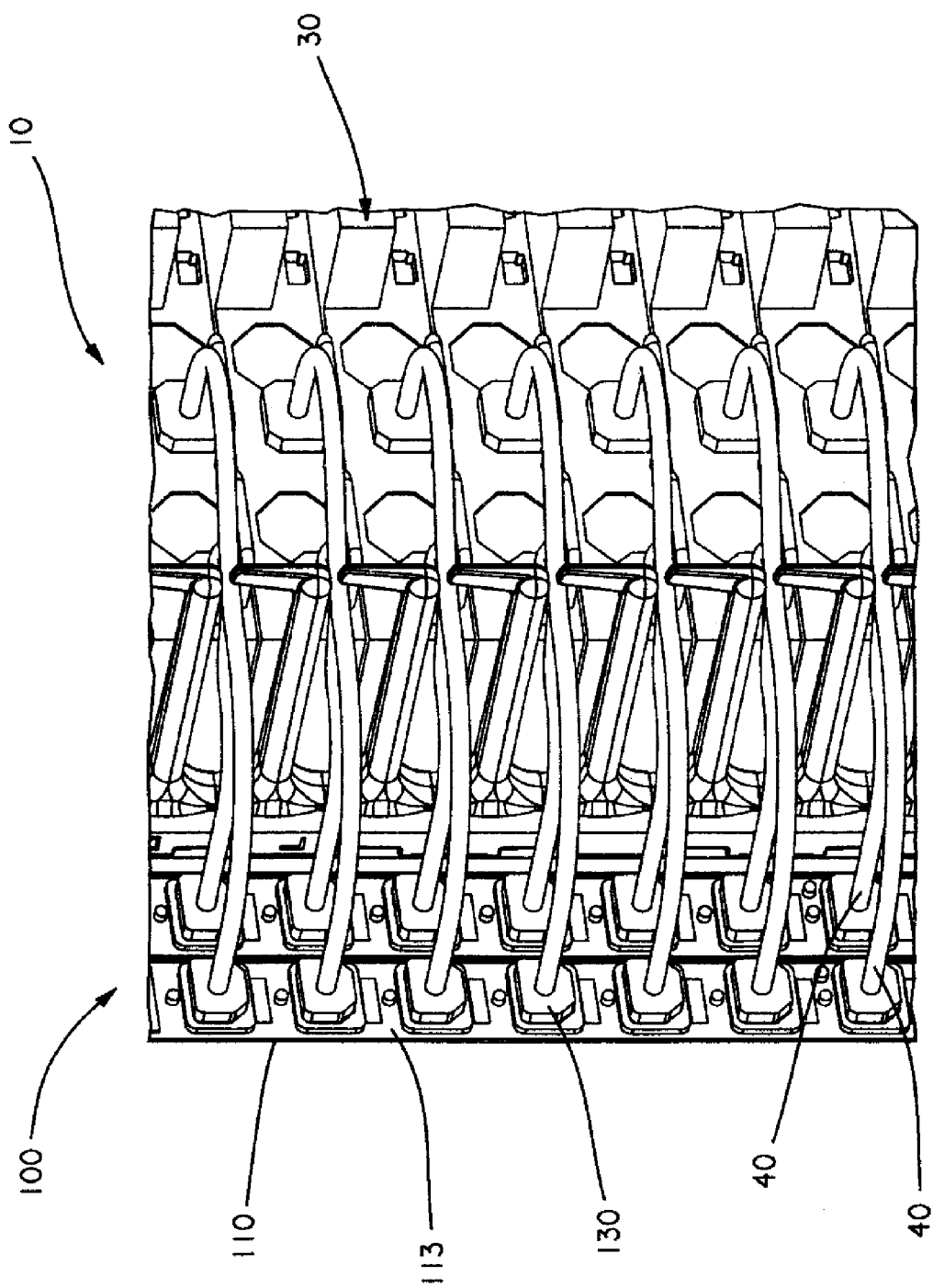
FIG. 10 is an enlarged perspective view of the POU's of FIG. 1, showing a plurality of power cords connected thereto.

Additionally, as best seen in FIG. 1, the cabinet 10 also includes one or more electronic devices 30 (e.g., servers, switches, patch panels, etc.). As best seen in FIG. 10, the electronic devices 30 are electrically connected to the outlets 130 of the POU 100 via power cords 40. Therefore, the POU 100 is adapted to distribute power from one or more power supplies to the cabinet 10, and in particular, the electronic devices 30.

Figure 2:
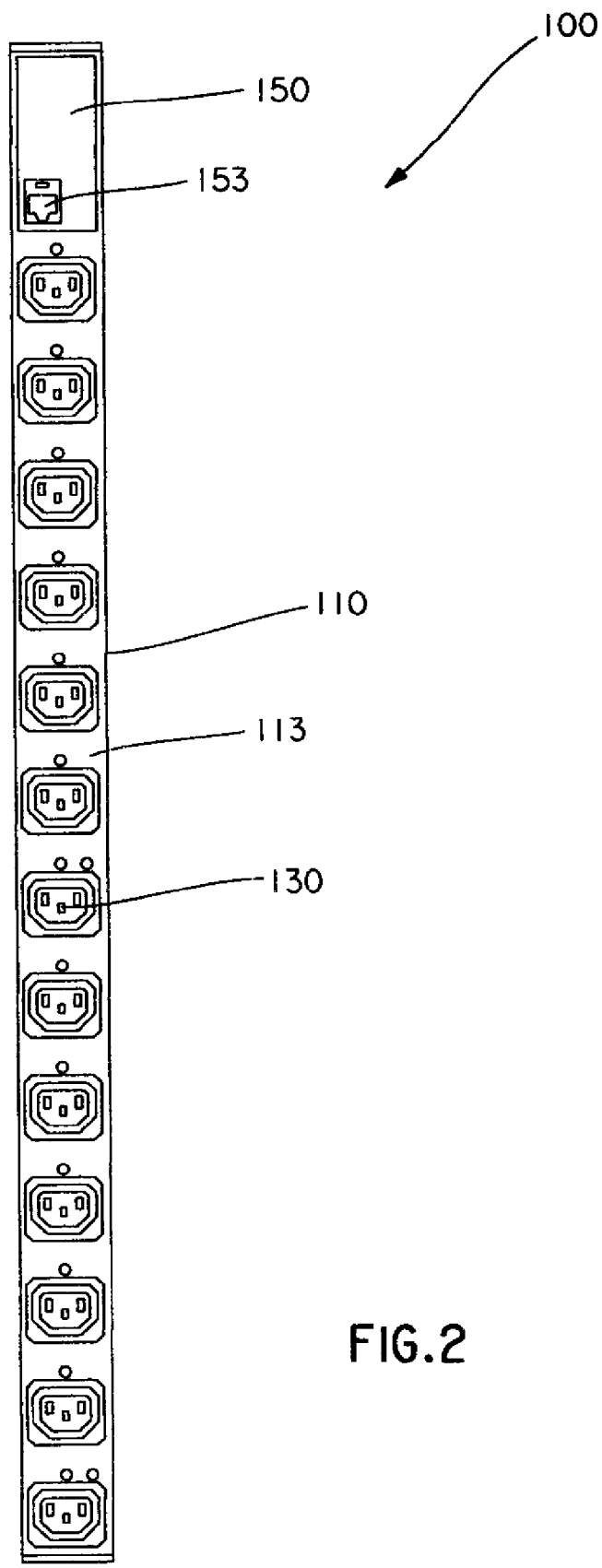
FIG. 2 is a front view of a POU according to an embodiment of the present invention.

A best seen in FIG. 2, the outlets 130 are spaced apart at intervals of one rack unit ("RU"), which is equivalent to 1.750 inches (44.45 mm). Therefore, the POU 100 is adapted to provide at least one outlet 130 for each RU of space in the cabinet 10. For example, if each electronic device 30 occupies 1 RU of space in the cabinet 10 (e.g., a 1-RU server), then the POU 100 is adapted to provide a dedicated outlet 130 for each electronic device 30. Alternatively, the outlets 130 may be spaced apart at intervals of one or more RU's (e.g., 1 RU, 2 RU, 4 RU, etc.). For example, a first set of outlets 130 may be spaced at 1 RU to accommodate one or more 1-RU electronic devices 30 and a second set of outlets 130 may be spaced at 2 RU to accommodate one or more 2-RU electronic devices 30.

Figure 3:
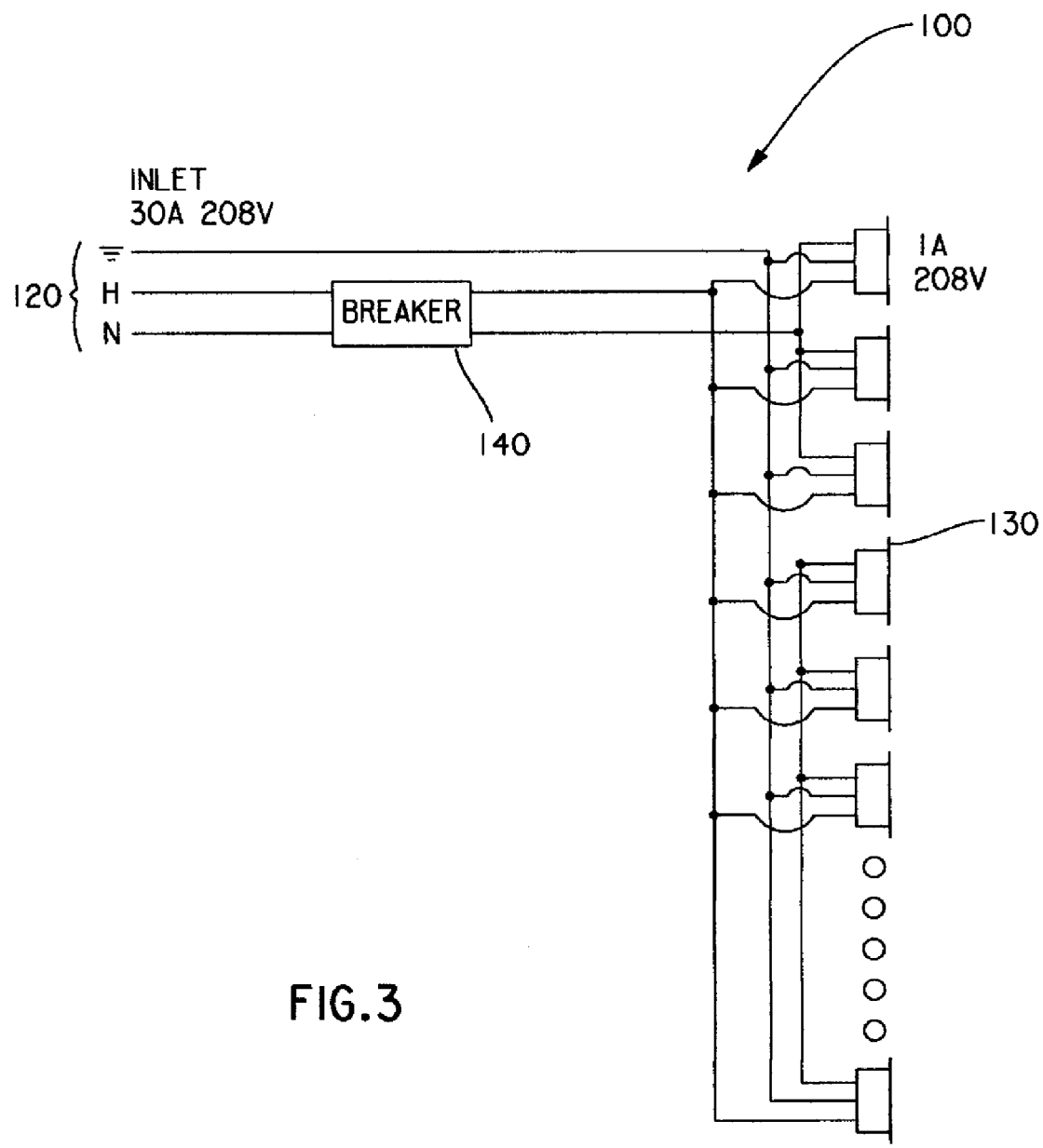
FIG. 3 is an exemplary wiring diagram for the POU of FIG. 2.

As best seen in FIG. 3, the outlets 130 are electrically connected to the circuit breaker 140, and the circuit breaker 140 is electrically connected to the inlet 120. For example, if the POU 100 includes 1 inlet 120 of 30 A (derated to 24 A) and 1 circuit breaker 140 of 20 A (derated to 16 A), the circuit breaker 140 being electrically connected to 16 outlets 130, then the POU 100 is adapted to provide approximately 1 A (derated) per outlet 130. If the outlets 130 are spaced apart at intervals of 1 RU, then the POU 100 is adapted to provide approximately 1 A (derated) per RU.

Figure 4:
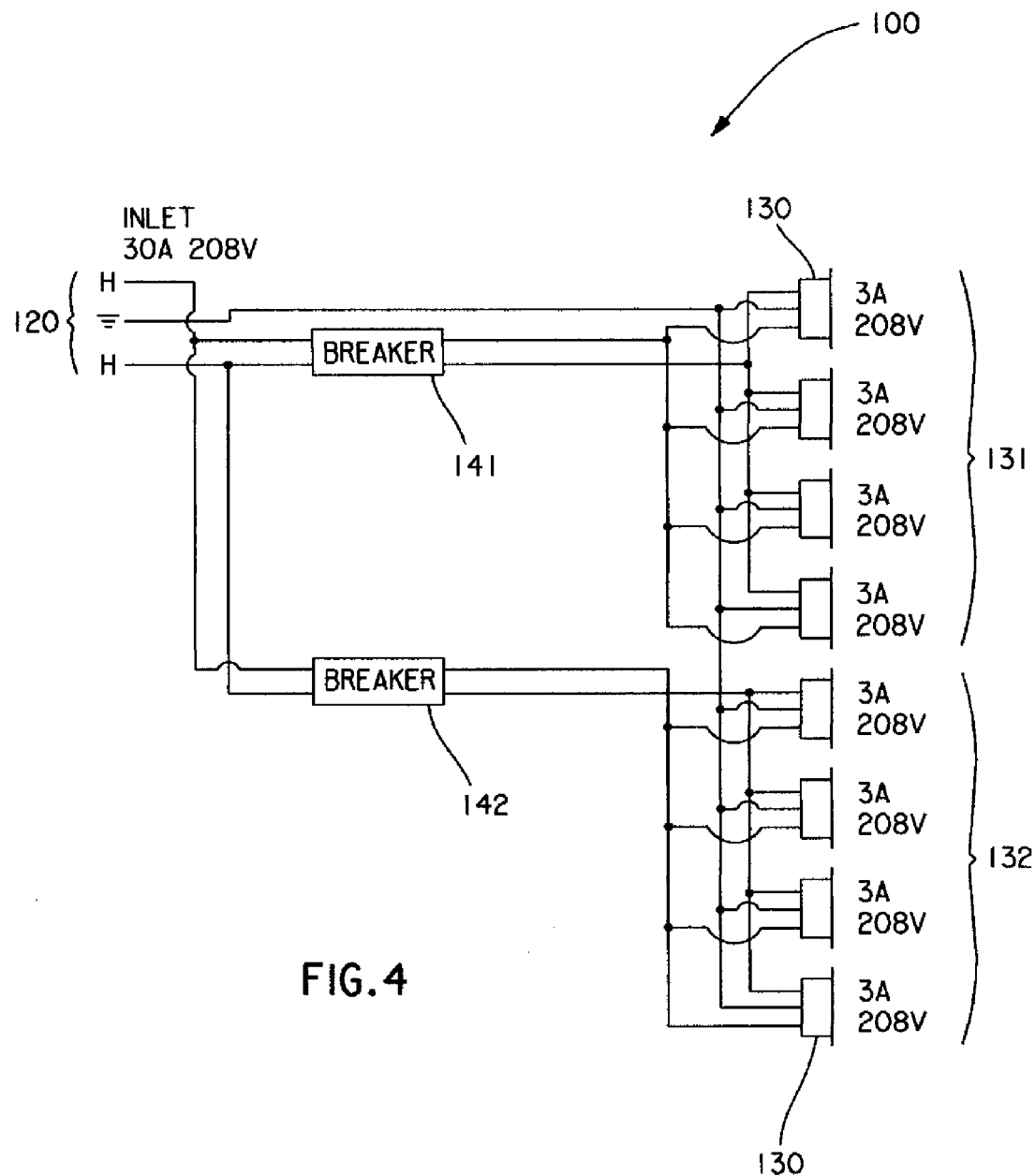
FIG. 4 is an exemplary wiring diagram for the POU of FIG. 2.

As best seen in FIG. 4, a first set of outlets 131 is electrically connected to a first circuit breaker 141, and a second set of outlets 132 is electrically connected to a second circuit breaker 142. For example, if the POU 100 includes 1 inlet of 30 A (derated to 24 A) and 2 circuit breakers 141, 142 of 20 A (derated to 16 A), each circuit breaker 141, 142 being electrically connected to 4 outlets 130, then the POU 100 is adapted to provide approximately 4 A (derated) per outlet 130. If the outlets 130 are spaced apart at intervals of 1 RU, then the POU 100 is adapted to provide approximately 4 A (derated) per RU.

Increasing the number of outlets 130 per circuit breaker 140 decreases the amount of current provided by the outlets 130. For example, it the POU 100 includes 1 inlet 120 of 30 A (derated to 24 A) and 2 circuit breakers 141, 142 of 20 A (derated to 16 A), each circuit breaker 141, 142 being electrically connected to 5 outlets 130, then the POU 100 is adapted to provide approximately 3 A (derated) per outlet 130. If the outlets 130 are spaced apart at intervals of 1 RU, then the POU 100 is adapted to provide approximately 3 A (derated) per RU of space in the cabinet 10.

Conversely, decreasing the number of outlets 130 per circuit breaker 140 increases the amount of current provided by the outlets 130. For example, if the POU 100 includes 1 inlet 120 of 30 A (derated to 24 A) and 2 circuit breakers 141, 142 of 20 A (derated to 16 A), each circuit breaker 141, 142 being electrically connected to 3 outlets 130, then the POU 100 is adapted to provide approximately 5 A (derated) per outlet 130. If the outlets 130 are spaced apart at intervals of 1 RU, then the POU 100 is adapted to provide approximately 5 A (derated) per RU of space in the cabinet 10.

Therefore, the POU 100 is adapted to accommodate the increasing power requirements of the electronic devices 30.

Figure 5:
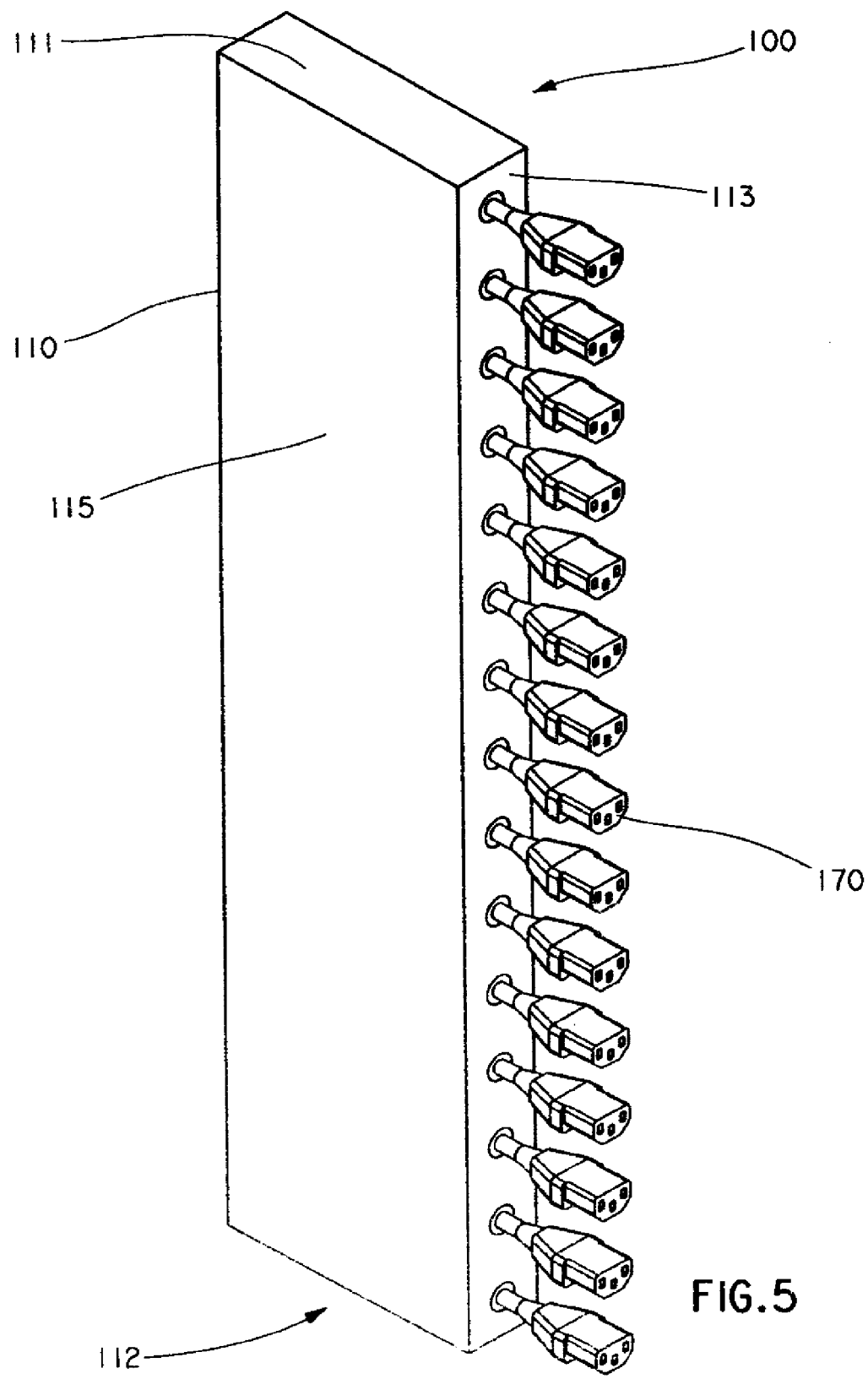
FIG. 5 is a perspective view of a POU having integrated power cords according to an embodiment of the present invention.

As best seen in FIG. 5, the POU 100 may include a plurality of integrated power cords 170. The integrated power cords 170 are a combination of the power cords 40 and the outlets 130.

Figure 6:
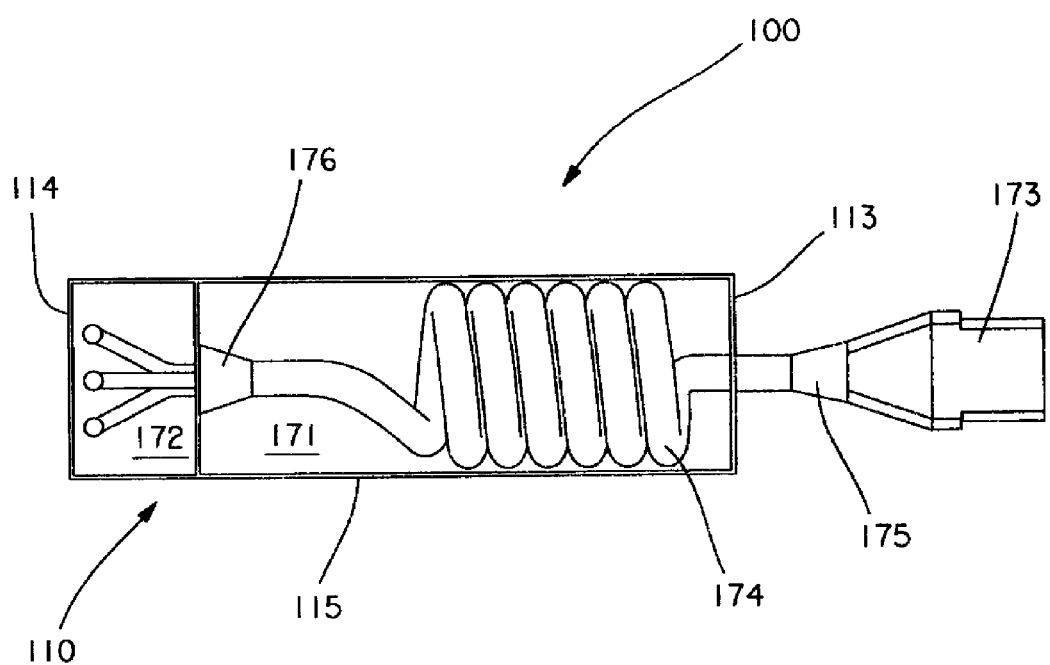
FIG. 6 is a top view of the POU of FIG. 5, showing an interior portion thereof.

As best seen in FIG. 6, the POU 100 includes a slack chamber 171 and a backplane 172. The integrated power cord 170 includes a socket 173 (e.g., an IEC C13 socket), a cord 174, a grommet 175, and a strain relief clip 176.

One end of the cord 174 is connected to the backplane 172. The other end of the cord 174 is connected to the socket 173. When the integrated power cord 170 is in use, the cord 174 extends to a desired length based on the proximity of the electronic device 30. Any excess slack remaining in the cord 174 is stored in the slack chamber 171. The socket 173 engages a corresponding plug (e.g., an IEC C14 plug) on the electronic device 30, electrically connecting the electronic device 30 to the POU 100. The grommet 175 holds the cord 174 at the desired length. The strain relief clip 176 prevents the cord 174 from being disconnected from the backplane 172. When the integrated power cord 170 is not in use, the cord 174 retracts into the slack chamber 171 of the POU 100, with only the socket 173 being accessible from the outside of the POU 100, as shown in FIG. 5.

As described above, the IEC C13 socket 173 is preferred because most electronic devices 30 include an IEC C14 plug. However, it is likewise contemplated that the integrated power cord 170 includes other types of connections (e.g., IEC C19, NEMA 5-15, etc.).

Figure 11:
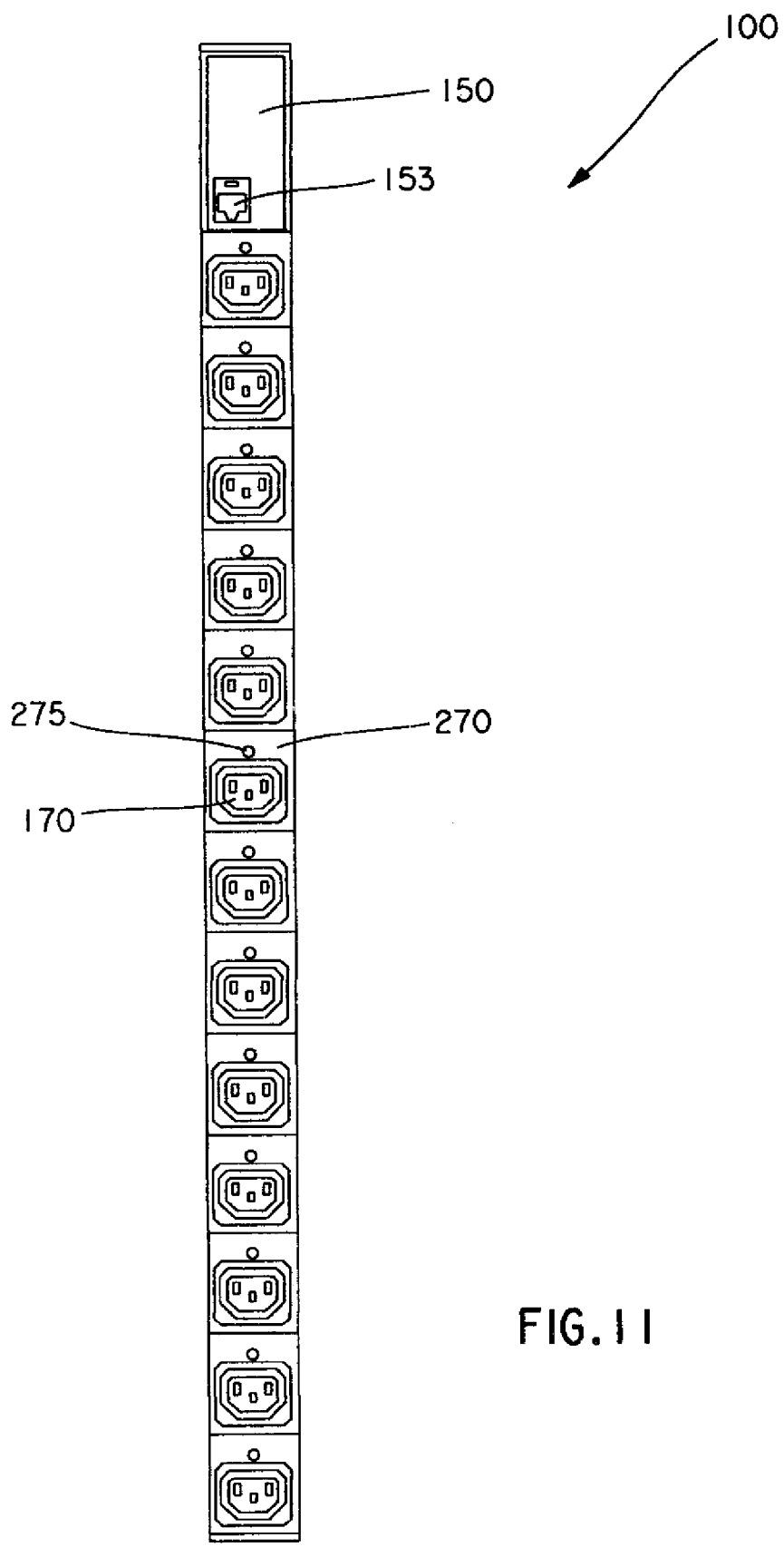
FIG. 11 is a front view of a POU having integrated power cords and indicators according to an embodiment of the present invention.
Figure 12:
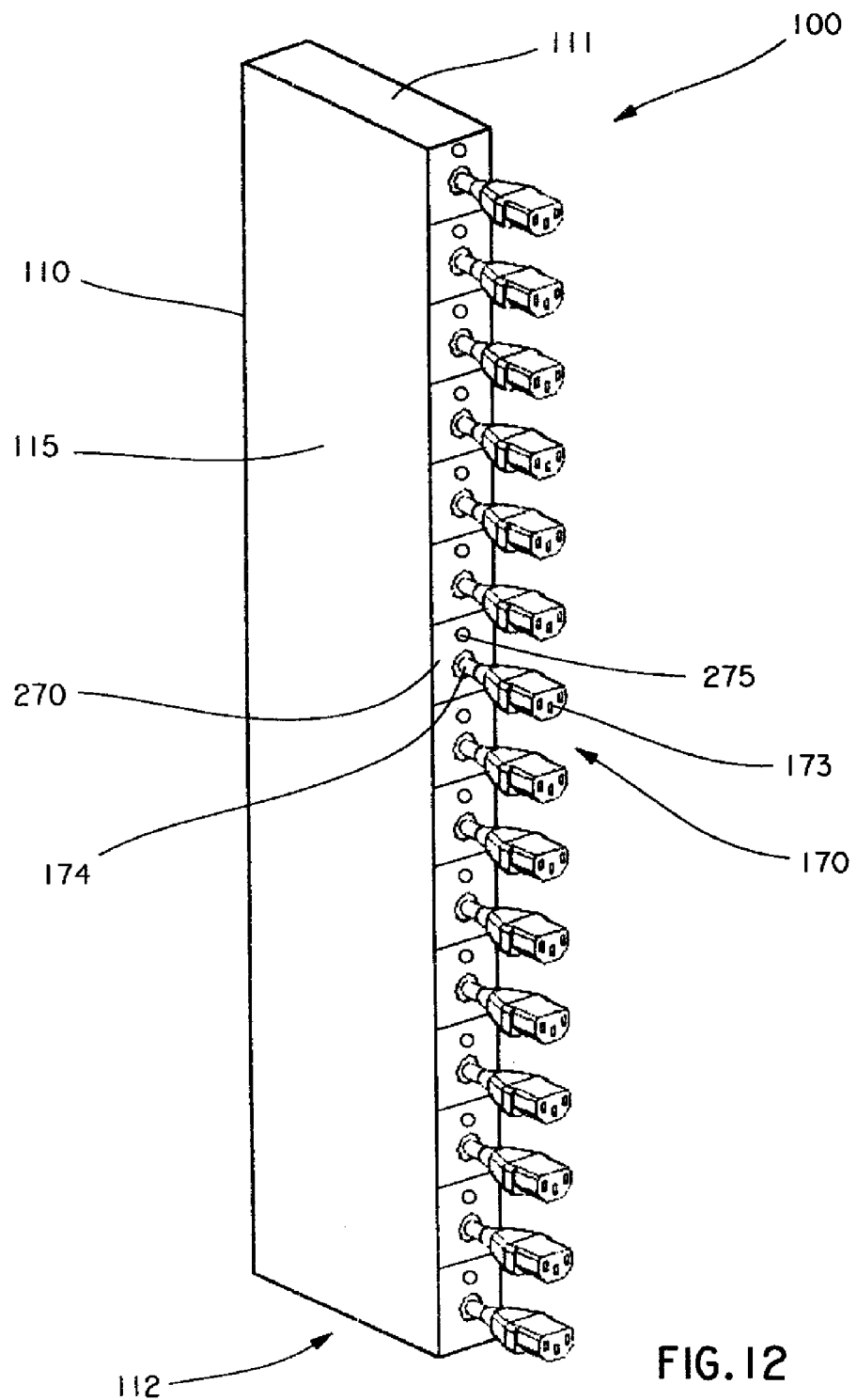
FIG. 12 is a perspective view of the POU of FIG. 11.
Figure 13:
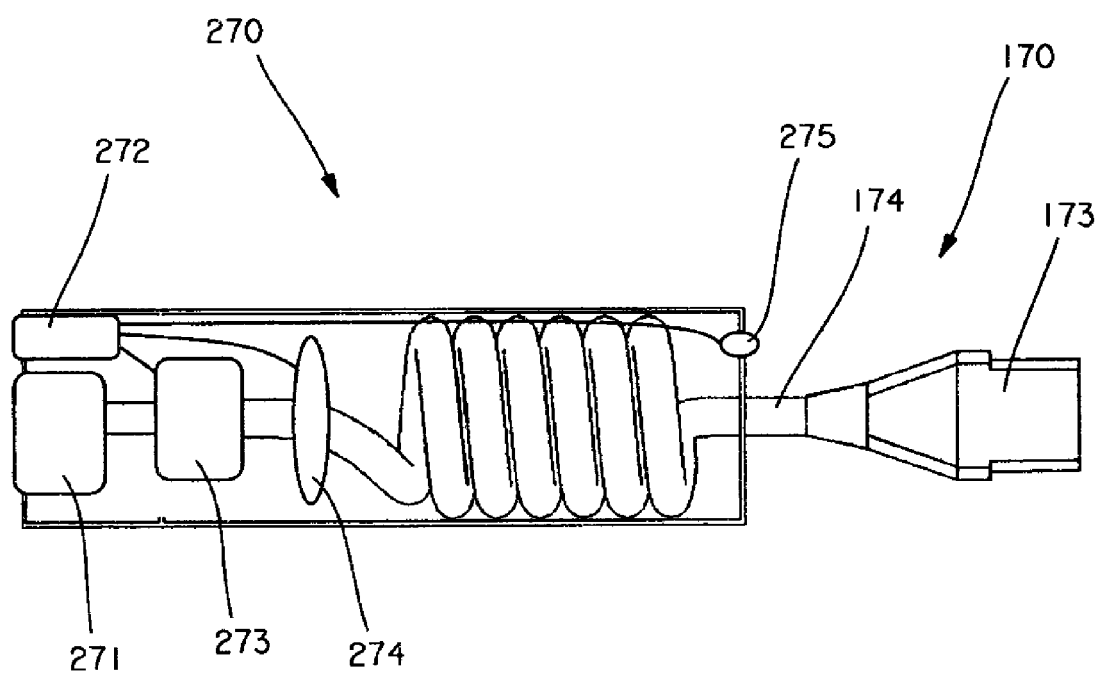
FIG. 13 is a top view of the POU of FIG. 11, showing an interior portion thereof.

Alternatively, as best seen in FIG. 11 and FIG. 12, the POU 100 may include one or more cordlet modules 270. As best seen in FIG. 13, the cordlet module 270 includes the integrated power cord 170, including the socket 173 and the cord 174. Additionally, the cordlet module 270 includes a cordlet module connector 271 for connecting the cordlet module 270 to the POU 100. The integrated power cord 170 is electrically connected to the inlet 120 of the POU 100 via the connector 271. Additionally, the cordlet module 270 includes a controller 272, a relay 273, a transformer 274, and an indicator 275, such as a light emitting diode ("LED"). The controller 272 is electrically connected to the relay 273, the transformer 274, and the indicator 275. Additionally, the relay 273 and the transformer 274 are electrically connected to the connector 271 via the cord 174. The relay 273 is adapted to switch the socket 173 (e.g., "OFF" and "ON"). The transformer 274 is adapted to meter the socket 173 (e.g., measure current). The indicator 275 is adapted to provide the status of the socket 173. For example, a "RED" LED 275 indicates that the socket 173 is "OFF" and a "GREEN" LED 275 indicates that the socket 173 is "ON". It is likewise contemplated that the indicator 275 provides additional information, such as a fault condition, about other components of the POU 100, such as the inlets 120 or the circuit breakers 140.

As best seen in FIG. 7, the outlets 130 are accessible from the front 113 of the POU 100. The outlets 130 are not spaced apart at intervals of 1 RU, although such a configuration, as shown in FIG. 2, is likewise contemplated. The inlet 120, the expansion module 150, and the PMM/PEMM 160 are accessible from the back 114 of the POU 100. The circuit breakers 140-142 are accessible from the outside of the POU 100, for example, from the back 114 of the housing 110. Alternatively, the circuit breakers 140-142 may be accessible via one or more removable access windows, doors, and/or panels in the housing 110.

Figure 8:
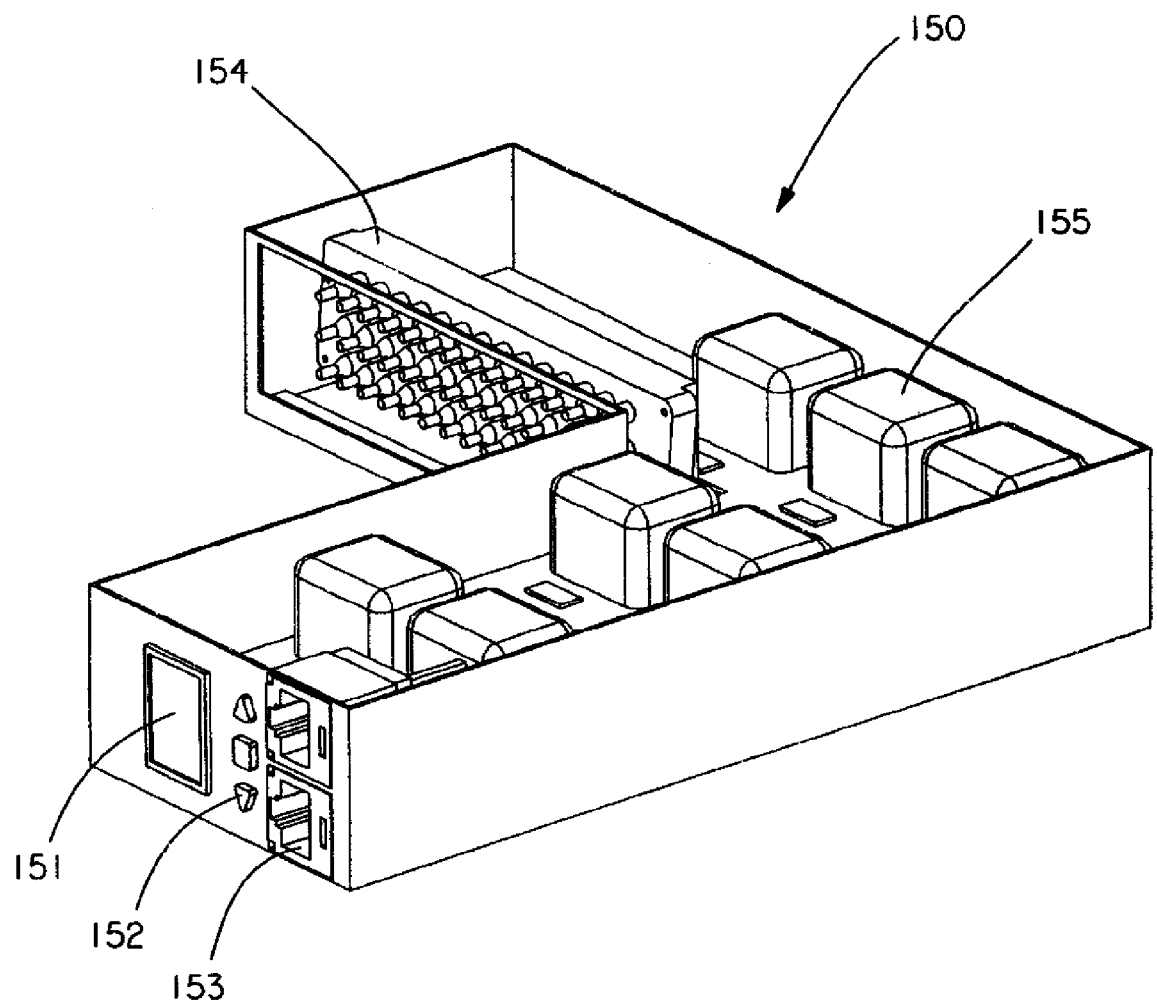
FIG. 8 is a perspective view of an expansion module for the POU of FIG. 7, showing an interior portion thereof.

As best seen in FIG. 8, the expansion module 150 includes a display 151, a display interface 152, and one or more external communications ports 153 (e.g., RJ-11, -14, -25, -45, etc.). The display 151, the display interface 152, and the external communication ports 153 are accessible from the front 113 of the POU 100. The expansion module 150 also includes a power connector 154 and one or more electronic components 155, such as printed circuit boards ("PCB's"), current transformers, processors, and/or network capable modules.

In certain embodiments of the present invention, the expansion module 150 may include one or more sensors (not shown). In combination with the other components of the expansion module 150, the sensors allow the expansion module 150 to measure one or more operating parameters associated with the cabinet 10, the electronic devices 30, and/or the POU 100, such as current, voltage, temperature, humidity, and/or accessibility. The measured parameters may be displayed locally (e.g., on the display 151), and/or remotely, as described below.

Figure 14:
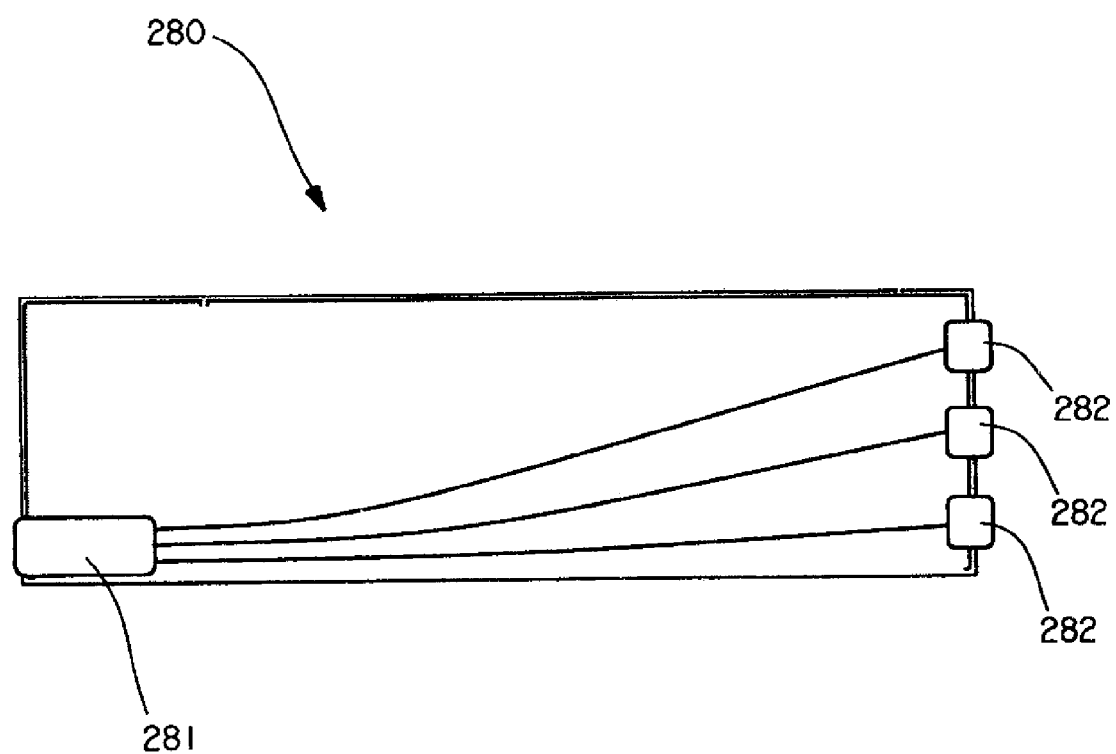
FIG. 14 is a top view of an interior portion of a sensor module for a POU according to an embodiment of the present invention.

Alternatively, as best seen in FIG. 14, the POU 100 may include one or more sensor modules 280. The sensor module 280 includes a sensor module connector 281 for connecting the sensor module 280 to the POU 100 and one or more sensor connections 282 for connecting one or more sensors to the sensor module 280.

In certain embodiments of the present invention, the expansion module 150 may include one or more relays (not shown). In combination with the other components of the expansion module 150, the relays allow the expansion module 150 to independently switch or control the outlets 130. For example, the relays allow the POU 100 to turn the outlets 130 "on" or "off" on an outlet-by-outlet basis.

In certain embodiments of the present invention, the expansion module 150 may include the external communication ports 153. In combination with the other components of the expansion module 150, the external communication ports 153 allow the expansion module 150 to communicate via one or more networks and/or the Internet. For example, a user may be able to meter and switch the outlets 130, as described above, from a remote location.

The PMM/PEMM 160, as described in U.S. Provisional Patent Application No. 61/030,405, filed Feb. 21, 2008, which is incorporated by reference herein, expands the networking capabilities of the POU 100, and in particular, the expansion module 150.

Figure 9:
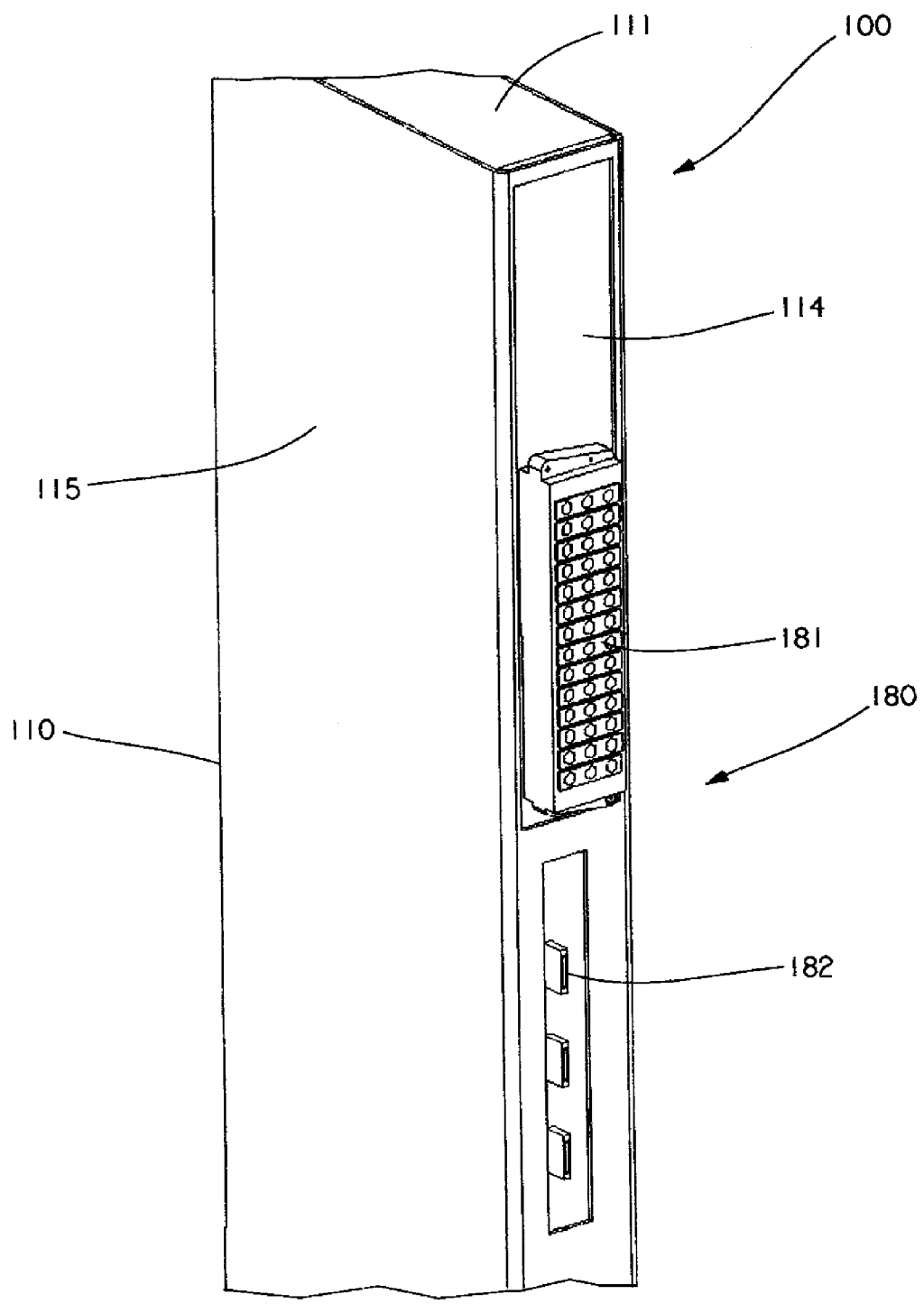
FIG. 9 is an enlarged perspective view of the POU of FIG. 7, showing the expansion module and the PMM/PEMM module removed from the back thereof.

As best seen in FIG. 9, the POU 100 includes a plurality of expansion ports 180, such as a power expansion socket 181 and a PMM/PEMM port 182. The expansion ports 180 are accessible from the back 114 of the POU 100. The expansion module 150 and the PMM/PEMM 160 may be removably connected to the POU 100 via the expansion ports 180. For example, the power connector 154 on the expansion module 150 may be removably connected to the power expansion socket 181. As another example, the PMM/PEMM 160 may be removably connected to the PMM/PEMM port 182.

In certain embodiments of the present invention, the components of the expansion module 150 and/or the PMM/PEMM 160 may be integrated into the POU 100.

For example, as shown in FIGS. 15-22, at least some of the functionality of the expansion module 150 and/or the PMM/PEMM 160 has been integrated into the POU 100.

Figure 15:
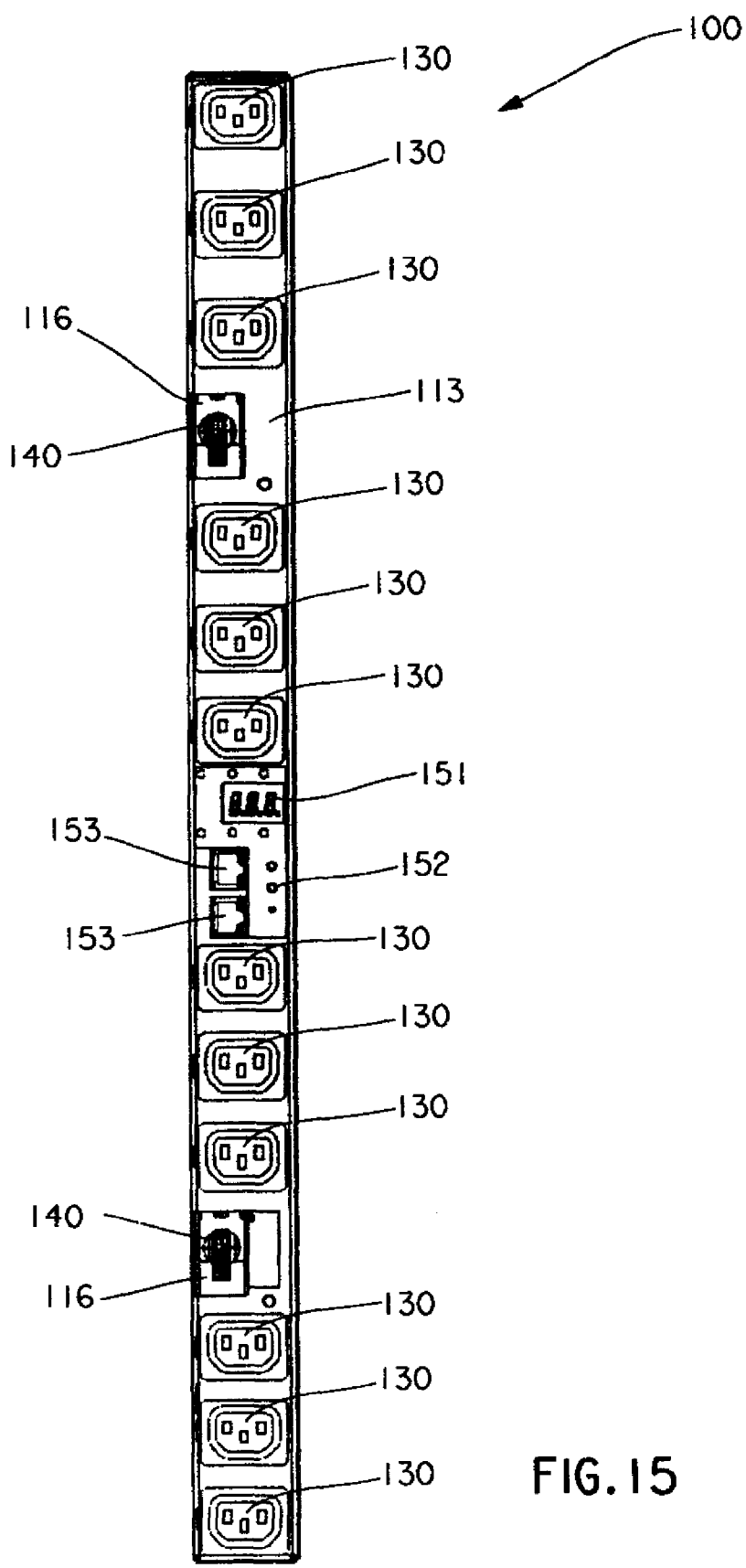
FIG. 15 is a front view of a POU having 12 IEC C13 outlets according to an embodiment of the present invention.
Figure 16:
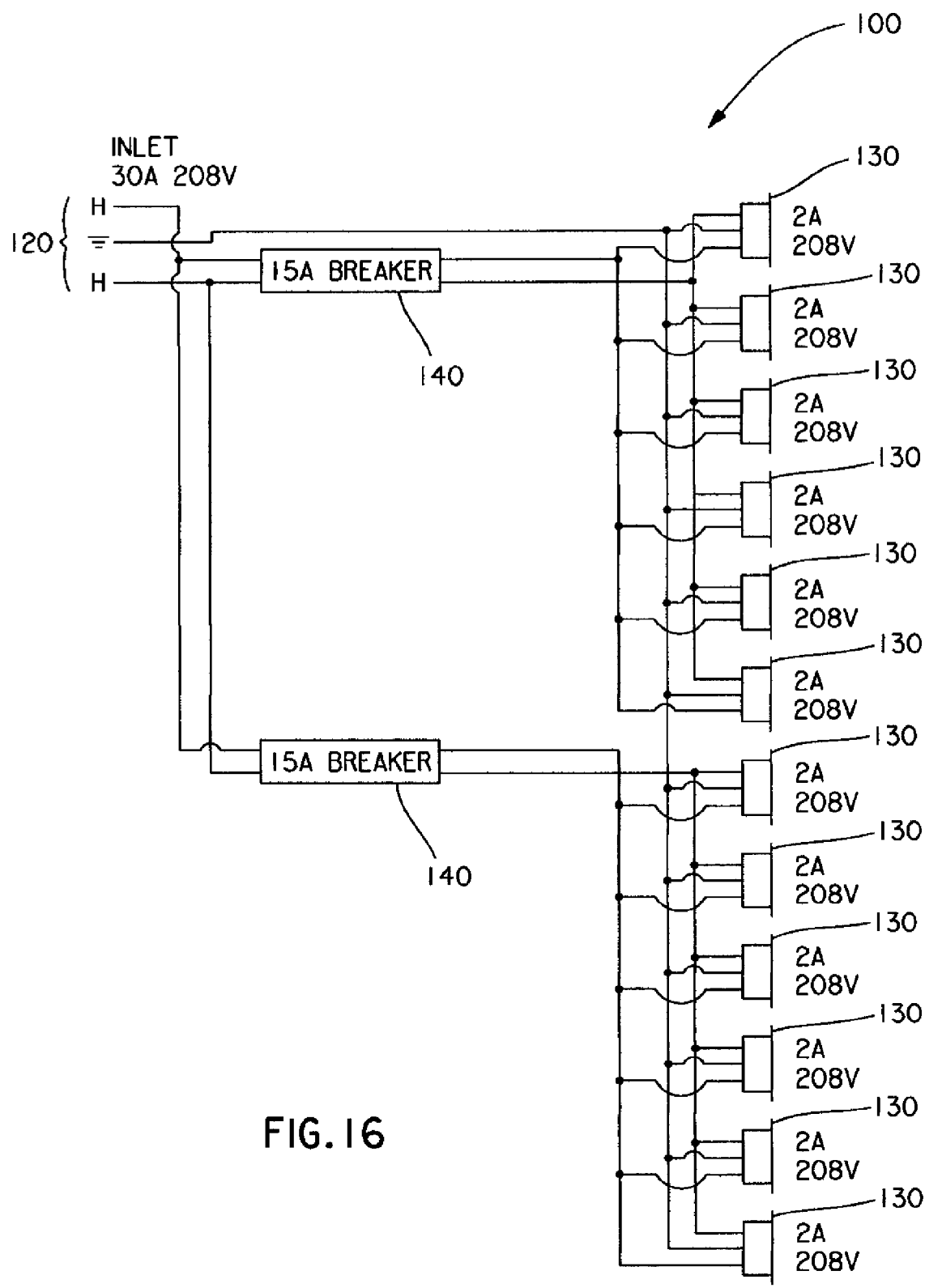
FIG. 16 is an exemplary wiring diagram for the POU of FIG. 15.

As best seen in FIG. 15, the POU 100 includes 12 IEC C13 outlets 130. As best seen in FIG. 16, if the POU 100 includes 1 inlet 120 of 30 A (derated to 24 A) and 2 circuit breakers 140 of 15 A (derated to 12 A), each circuit breaker 140 being electrically connected to 6 IEC C13 outlets 130, then the POU 100 is adapted to provide approximately 2 A (derated) per IEC C13 outlet 130. If the IEC C13 outlets 130 are spaced apart at intervals of 1 RU, then the POU 100 is adapted to provide approximately 2 A (derated) per RU.

Figure 17:
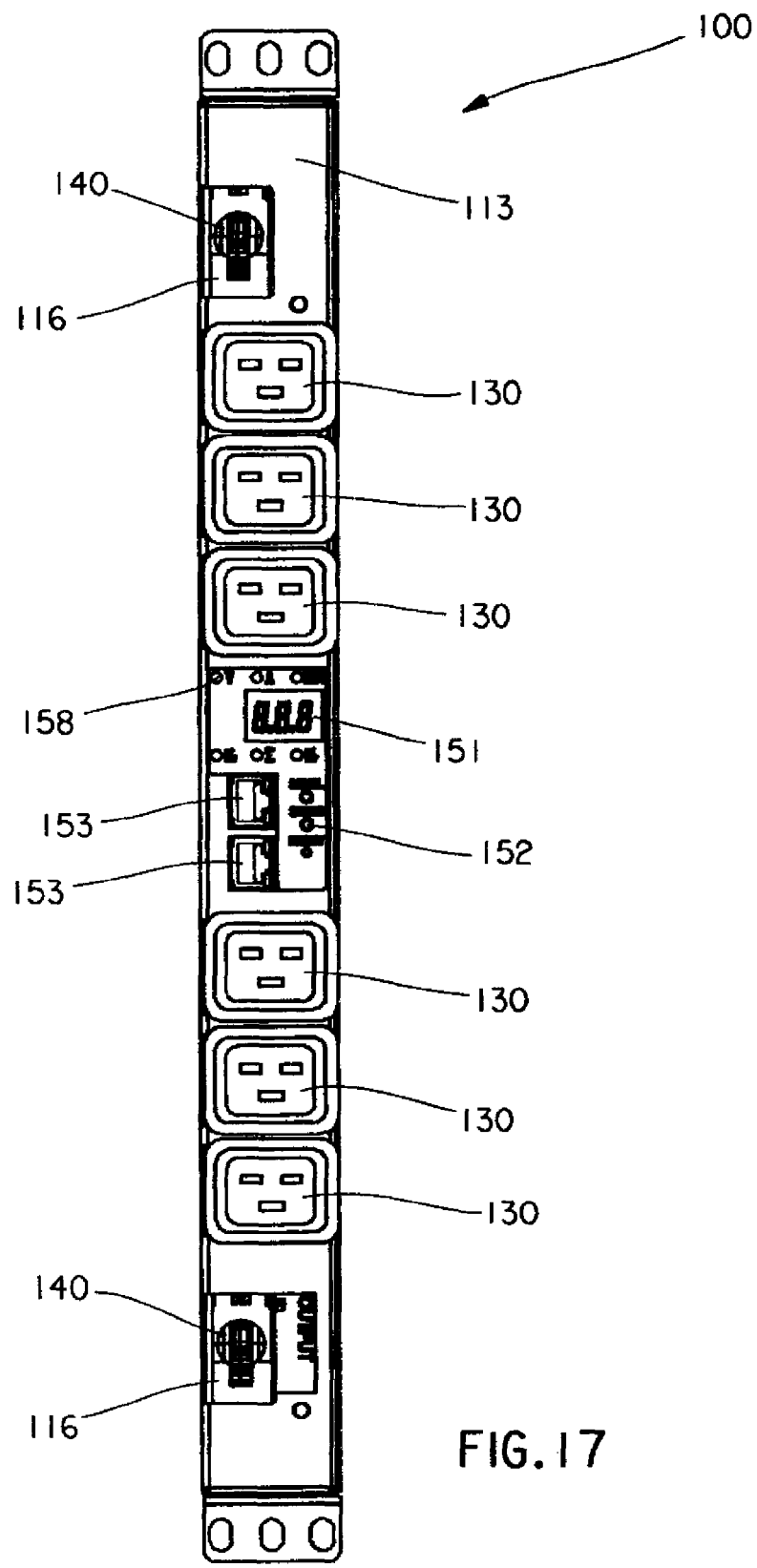
FIG. 17 is a front view of a POU having 6 IEC C19 outlets according to an embodiment of the present invention.
Figure 18:
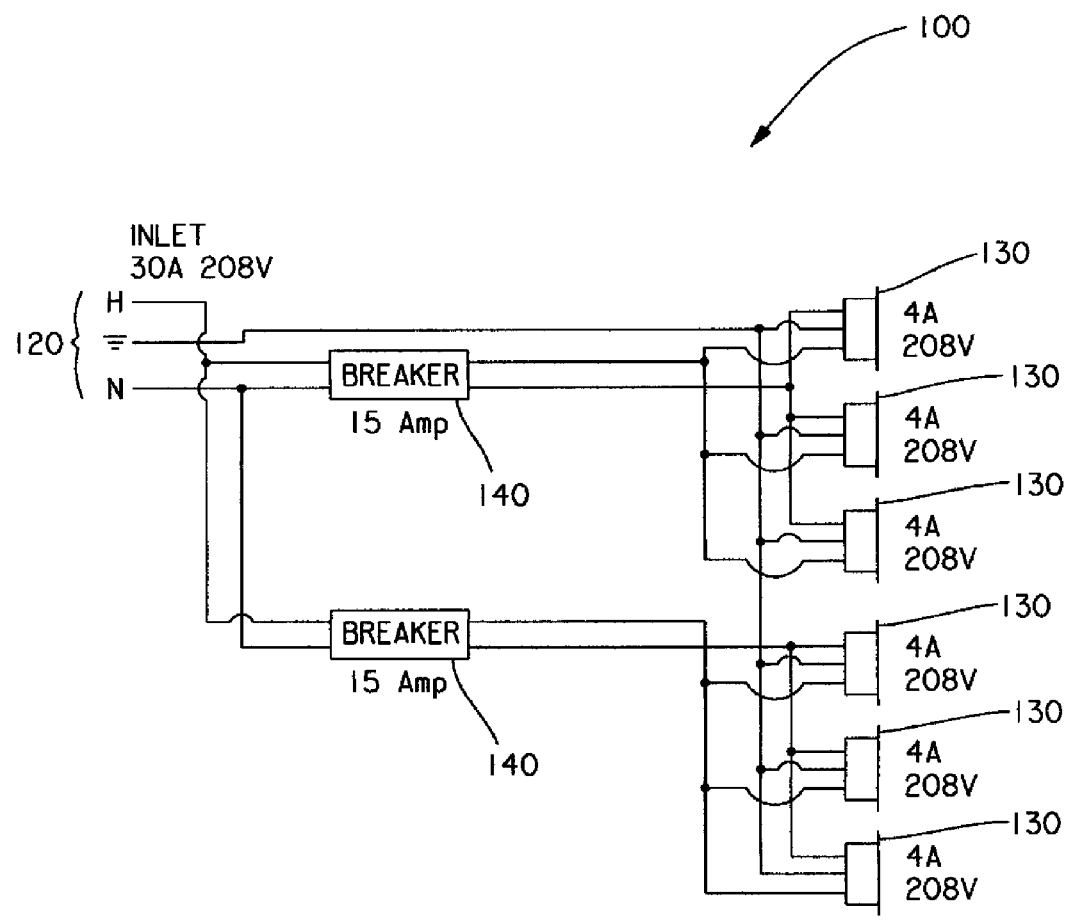
FIG. 18 is an exemplary wiring diagram for the POU of FIG. 17.

Alternatively, as best seen in FIG. 17, the POU 100 includes 6 IEC C19 outlets 130. As shown in FIG. 18, if the POU 100 includes 1 inlet 120 of 30 A (derated to 24 A) and 2 circuit breakers 140 of 15 A (derated to 12 A), each circuit breaker 140 being electrically connected to 3 IEC C19 outlets 130, then the POU 100 is adapted to provide approximately 4 A (derated) per IEC C19 outlet 130. If the IEC C19 outlets 130 are spaced apart at intervals of 1 RU, then the POU 100 is adapted to provide approximately 4 A (derated) per RU.

Figure 19:
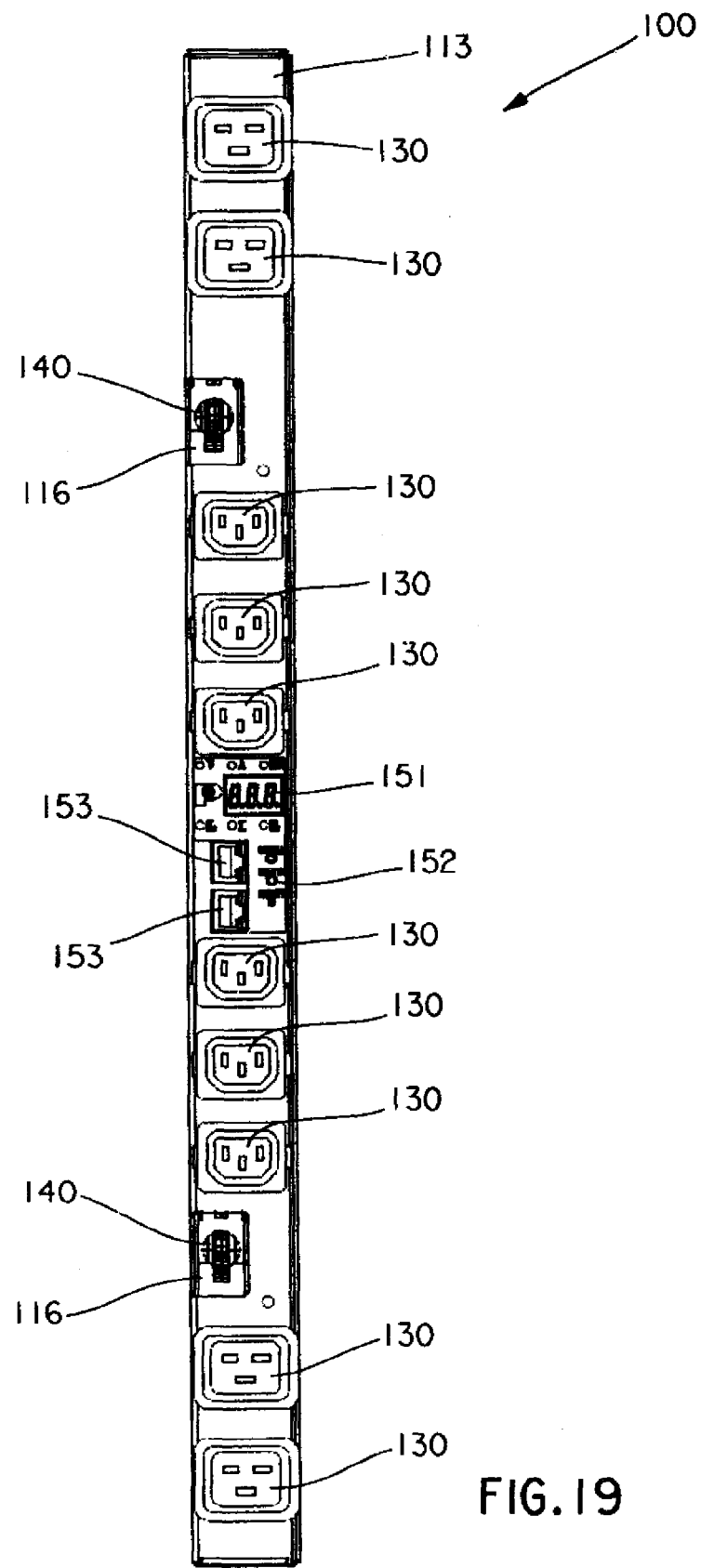
FIG. 19 is a front view of a POU having 6 IEC C13 outlets and 4 IEC C19 outlets according to an embodiment of the present invention.

Alternatively, as best seen in FIG. 19, the POU 200 includes 6 IEC C19 outlets 130 and 4 IEC C19 outlets 130. That is, the POU 100 is adapted to receive one or more types of outlets 130 (e.g., IEC C13, IEC C19, etc.).

Figure 20:
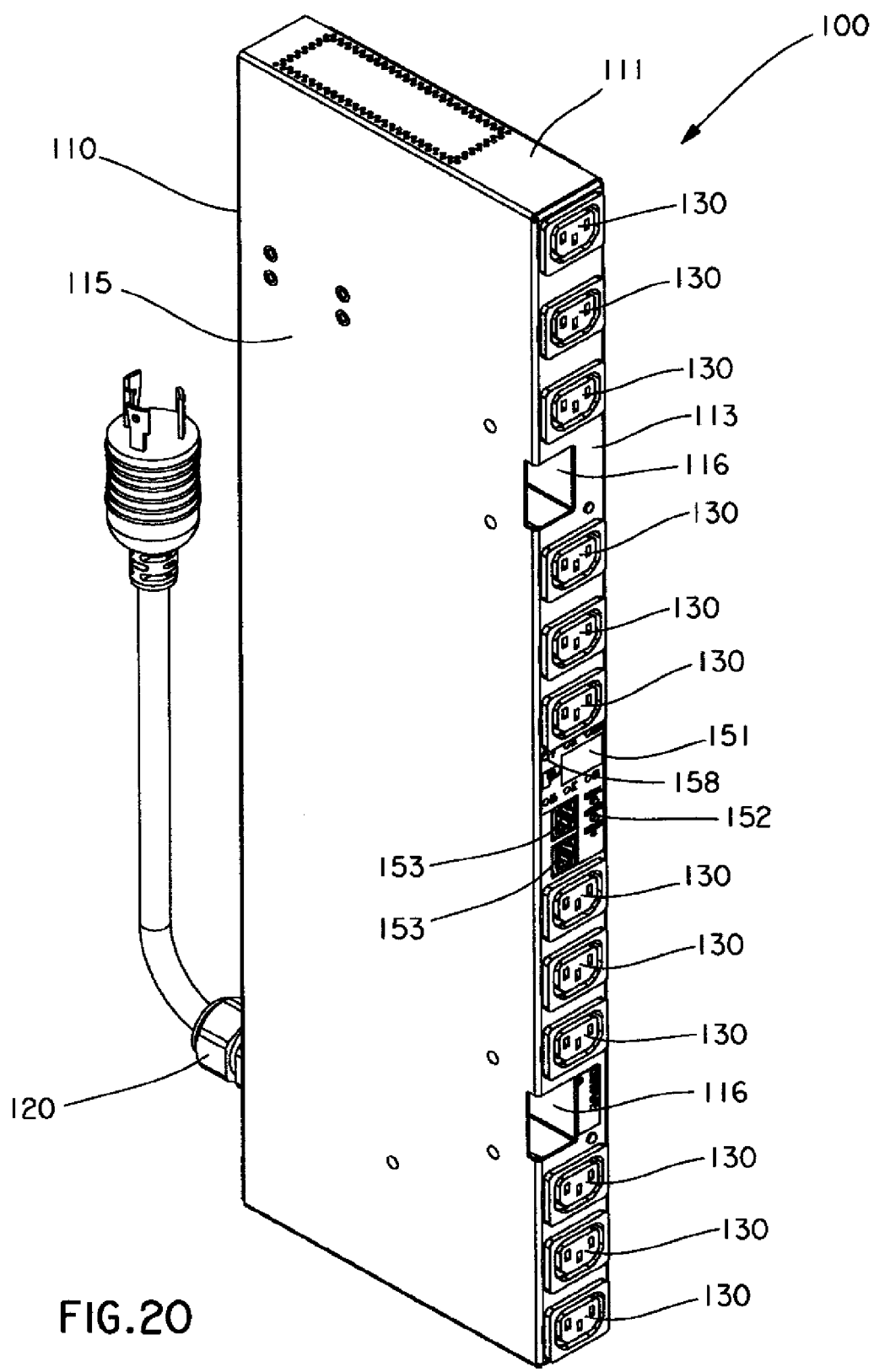
FIG. 20 is a perspective view of the POU of FIG. 15.

As best seen in FIG. 20, the circuit breakers 140 are accessible from the front 111 of the housing 110 of the POU 100. The front 111 of the housing 110 includes one or more recesses 116. The circuit breakers 140 are disposed in the recesses 116, which restrict access to the circuit breakers 140, and therefore, helps to prevent the circuit breakers 140 from being tripped inadvertently. Additionally, the circuit breakers 140 are disposed in the recesses 116 in such a way that the circuit breakers 140 are more difficult to trip (i.e., open) than reset (i.e., close), which also helps to prevent the circuit breakers 140 from being tripped inadvertently.

As best seen in FIG. 19, the POU 100 includes one or more indicators 158, such as LED's, in addition to the display 151, the display interface 152, and the communications ports 153, which are accessible from the front 111 of the POU 100.

In certain embodiments of the present invention, the POU 100 may include a socket (e.g., an IEC 60309 socket) or a terminal block for accommodating a variety of different power sources (e.g., current is commonly provided between 10 A and 60 A, voltage is commonly provided between 90V and 250V, international current, voltage, and/or frequency may vary).

In certain embodiments of the present invention, the POU 100 may include a plurality of inlets 120. For example, a first inlet 120 may be connected to a primary power source and a second inlet 120 may be connected to a secondary or redundant power source.

In certain embodiments of the present invention, the cabinet 10 may include a plurality of POU's 100. For example, a first POU 100 may be connected to a primary power source and a second POU 100 may be connected to a secondary or redundant power source. As another example, a plurality of POU's 100 may be connected in series (e.g., in a daisy chain) to a single power source. As another example, the plurality of POU's 100 may be daisy-chained for networking purposes (e.g., one of the POU's 100 is the master and the remaining POU's 100 are the slaves).

Figure 21:
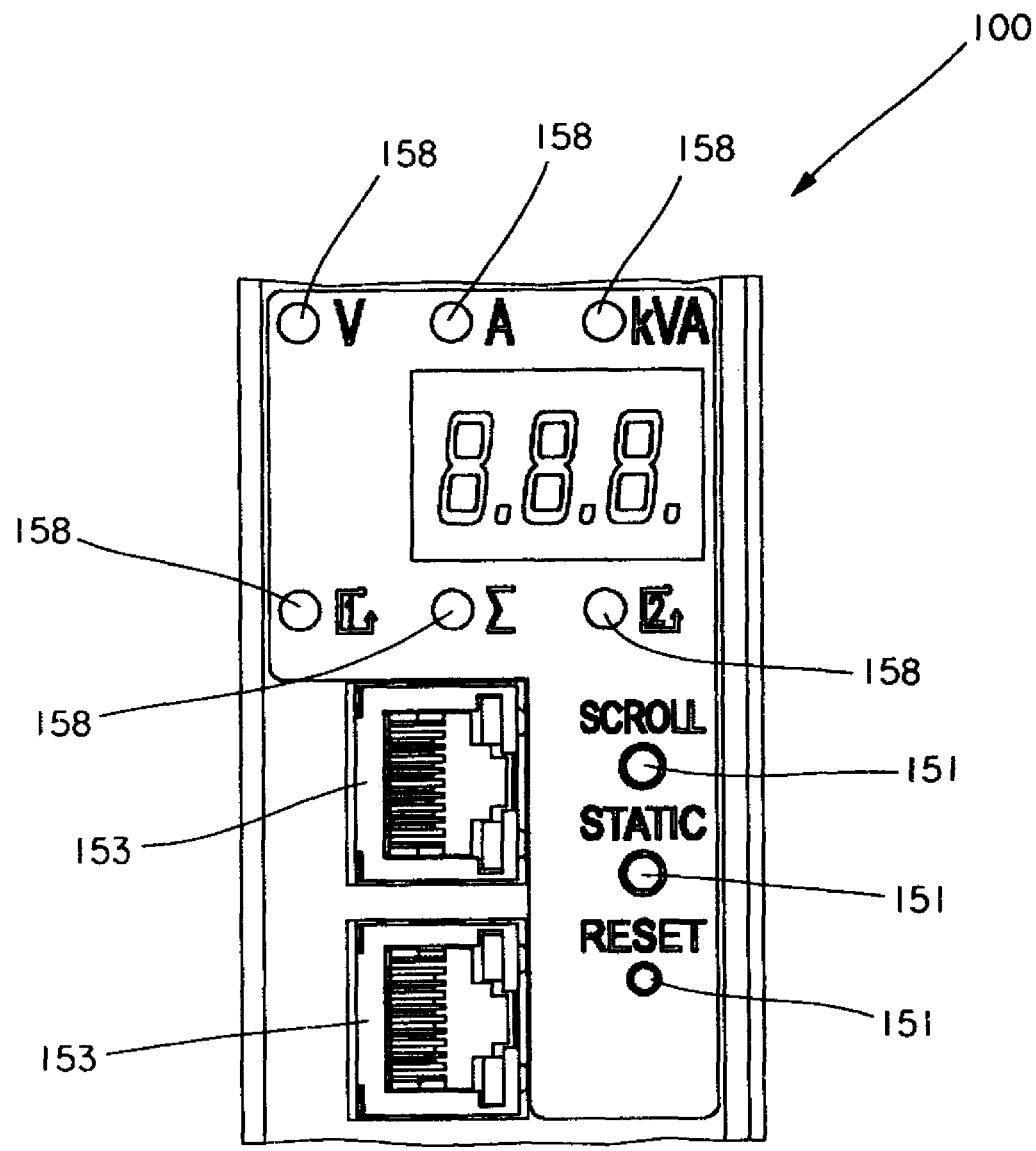
FIG. 21 is an enlarged front view of the POU of FIG. 15, showing the display, the display interface, the communication ports, and the indicators.
Figure 22:
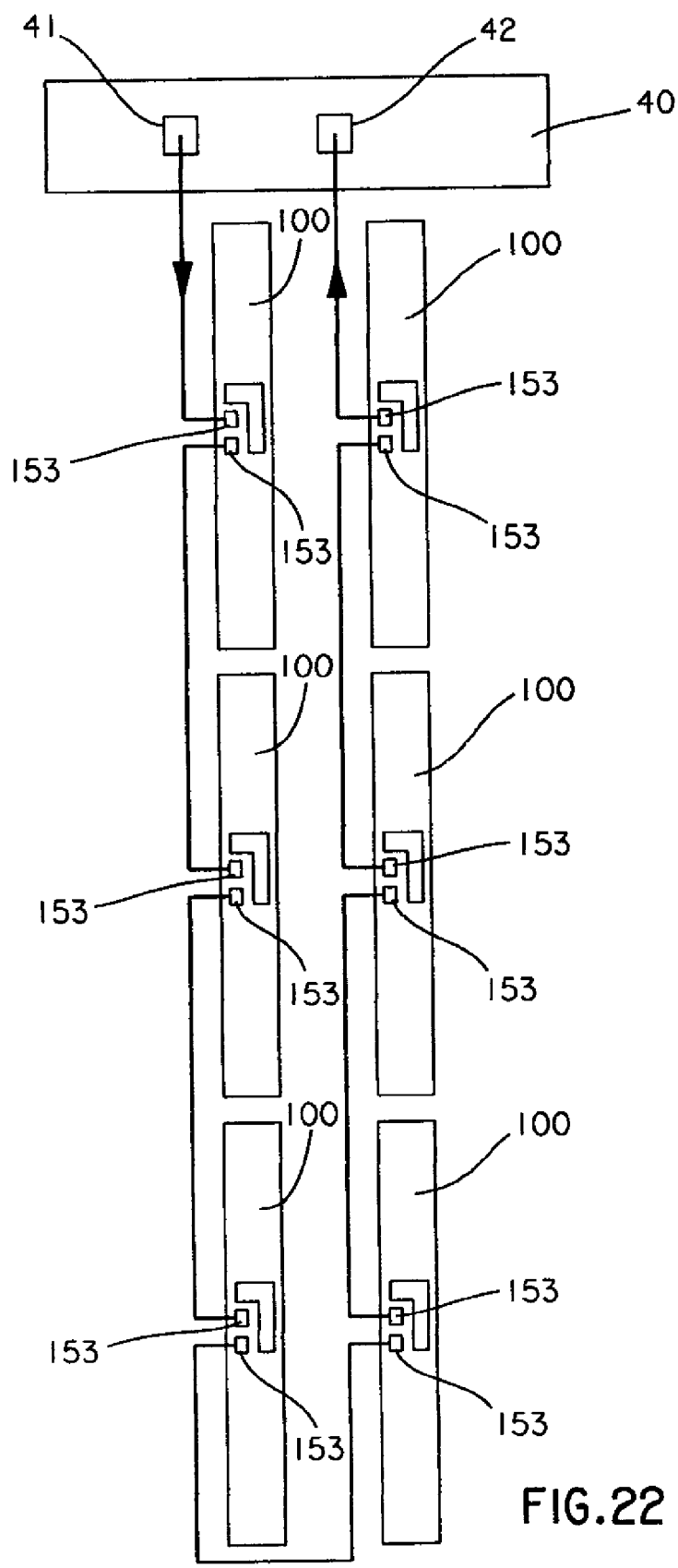
FIG. 22 is front view of 6 POU's connected in series to a single switch port according to an embodiment of the present invention.

Preferably, the POU 100 includes 2 RJ45 ports 153, as shown in FIG. 21. The RJ45 ports 153 allow multiple POU's 100 to be connected to a network via a single network port. For example, as best seen in FIG. 22, 6 POU's 100 are connected in series via the RJ45 ports 153. A first POU 100 is connected to a switch 40 via a first switch port 41, which allows all of the POU's 100 to communicate over the network. A second POU 100 may be connected to the switch 40 via a second switch port 42, or to a second switch (not shown), for redundancy. Therefore, certain embodiments of the present invention allow multiple POU's to be connected in series to a single switch port.

In certain embodiments of the present invention, the power cords 40 may be labeled and/or color-coded to indicate, for example, the power source. For example, power cords 40 connected to a primary power source may be color-coded "GREEN" and/or labeled "PRIMARY POWER". As another example, power cords 40 connected to a secondary or redundant power source may be color-coded "RED" and/or labeled "SECONDARY POWER" or "REDUNDANT POWER". Alternatively or additionally, any of the components in the cabinet 10, the electronic devices 30, and/or the POU 100 (e.g., the outlets 130) may be labeled and/or color-coded as described above.

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications and incorporate those features that come Within the spirit and scope of the invention.

The invention claimed is:

1. A power outlet unit comprising:
   a housing having a front panel and a back panel opposite the front panel;
   a power inlet disposed in the back panel of the housing; and
   a first plurality of power outlets disposed in the front panel of the housing and electrically connected to the power inlet, each of the first plurality of power outlets spaced apart at intervals of one rack unit equivalent to 1.750 inches.

2. The power outlet unit of claim 1, wherein the power outlet unit is adapted to provide at least 2 amperes per rack unit.

3. The power outlet unit of claim 1, wherein the power outlet unit is adapted to provide at least 3 amperes per rack unit.

4. The power outlet unit of claim 1, wherein the power outlet unit is adapted to provide at least 4 amperes per rack unit.

5. The power outlet unit of claim 1, wherein the power outlet unit is adapted to provide at least 5 amperes per rack unit.

6. The power outlet unit of claim 1, wherein the power outlet unit includes at least two different types of power outlets.

7. The power outlet unit of claim 1, wherein the power outlet unit includes an integrated power cord.

8. The power outlet of claim 1, wherein the power outlet unit includes a cordlet module.

9. The power outlet unit of claim 1, wherein the power outlet unit includes a sensor module.

10. The power outlet unit of claim 1, further comprising a display.

11. The power outlet unit of claim 10, further comprising a display interface associated with the display.

12. The power outlet unit of claim 1, further comprising at least two communications ports.

13. The power outlet unit of claim 12, wherein the at least two communications ports include a first RJ45 port and a second RJ45 port.

14. The power outlet unit of claim 13, wherein the power outlet unit is connectable to a switch via the first RJ45 port.

15. The power outlet unit of claim 14, wherein the power outlet unit is connectable to a second power outlet unit via the second RJ45 port.

16. The power outlet unit of claim 1, further comprising a second plurality of power outlets disposed in the housing and electrically connected to the power inlet, each of the second plurality of power outlets spaced apart at intervals of one rack unit.

17. The power outlet unit of claim 16, wherein the first plurality of power outlets includes six IEC C13 sockets and the second plurality of power outlets includes six IEC C13 sockets.

18. The power outlet unit of claim 16, wherein the first plurality of power outlets includes three IEC C19 sockets and the second plurality of power outlets includes three IEC C19 sockets.

19. The power outlet unit of claim 16, wherein the first plurality of power outlets includes six IEC C13 sockets and the second plurality of power outlets includes four IEC C19 sockets.

20. The power outlet unit of claim 1, further comprising a first circuit breaker disposed in the housing and electrically connected to the power inlet and the first plurality of power outlets.

21. The power outlet unit of claim 20, further comprising a second plurality of power outlets disposed in the housing and electrically connected to the power inlet, each of the second plurality of power outlets spaced apart at intervals of one rack unit.

22. The power outlet unit of claim 21, further comprising a second circuit breaker disposed in the housing and electrically connected to the power inlet and the second plurality of power outlets.

23. The power outlet unit of claim 22, wherein the first circuit breaker is disposed in a first recess and the second circuit breaker is disposed in a second recess.

* * * * *